US007653854B2

(12) United States Patent
Anzou et al.

(10) Patent No.: US 7,653,854 B2
(45) Date of Patent: Jan. 26, 2010

(54) SEMICONDUCTOR INTEGRATED CIRCUIT HAVING A (BIST) BUILT-IN SELF TEST CIRCUIT FOR FAULT DIAGNOSING OPERATION OF A MEMORY

(75) Inventors: Kenichi Anzou, Kawasaki (JP); Chikako Tokunaga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 292 days.

(21) Appl. No.: 11/774,075

(22) Filed: Jul. 6, 2007

(65) Prior Publication Data

US 2008/0022176 A1    Jan. 24, 2008

(30) Foreign Application Priority Data

Jul. 7, 2006    (JP)    .............................. 2006-188391

(51) Int. Cl.
*G01R 31/28* (2006.01)
(52) U.S. Cl. ...................................... 714/733
(58) Field of Classification Search ................. 714/718, 714/733
See application file for complete search history.

(56) References Cited

U.S. PATENT DOCUMENTS

| 6,067,262 | A | * | 5/2000 | Irrinki et al. ................. 365/201 |
| 6,108,252 | A | * | 8/2000 | Park ........................... 365/201 |
| 6,304,989 | B1 | * | 10/2001 | Kraus et al. .................. 714/733 |
| 6,496,947 | B1 | * | 12/2002 | Schwarz ....................... 714/30 |
| 6,643,807 | B1 | * | 11/2003 | Heaslip et al. ............... 714/719 |
| 6,651,202 | B1 | * | 11/2003 | Phan .......................... 714/733 |
| 6,769,081 | B1 | * | 7/2004 | Parulkar ...................... 714/733 |
| 7,206,984 | B2 | | 4/2007 | Anzou |
| 2005/0120270 | A1 | | 6/2005 | Anand et al. |
| 2005/0166111 | A1 | | 7/2005 | Chien |
| 2006/0190788 | A1 | * | 8/2006 | Jasinski et al. ............... 714/733 |
| 2007/0011535 | A1 | | 1/2007 | Anzou et al. |

FOREIGN PATENT DOCUMENTS

JP    2004-086996    3/2004

OTHER PUBLICATIONS

Bardell et al, Built-In Test for VLSI: Pseudorandom Techniques, John Wiley & Sons, Inc., 1987, pp. 124-131.

* cited by examiner

*Primary Examiner*—James C Kerveros
(74) *Attorney, Agent, or Firm*—Turocy & Watson, LLP

(57) ABSTRACT

According to the present invention, there is provided a semiconductor integrated circuit having: a BIST including a data generator, an address generator, a control signal generator, a result analyzer, a BIST controller, and a diagnostic data storage circuit including a first capture register which captures and outputs, in accordance with a first clock, a latest address signal and the BIST state signal output from said BIST controller while the flag signal is in as state that no fault is detected, and maintains outputs when the flag signal is in a state that a fault is detected. The semiconductor integrated circuit can further include a memory collar having a memory cell, a second capture register, a comparator, and a flag register. The semiconductor integrated circuit can perform a fault diagnosing operation of a memory by using a comparator type BIST circuit.

18 Claims, 12 Drawing Sheets

SEMICONDUCTOR INTEGRATED CIRCUIT HAVING A (BIST) BUILT-IN SELF TEST CIRCUIT FOR FAULT DIAGNOSING OPERATION OF A MEMORY

CROSS REFERENCE TO RELATED APPLICATION

This application is based upon and claims benefit of priority under 35 USC §119 from the Japanese Patent Application No. 2006-188391, filed on Jul. 7, 2006, the entire contents of which are incorporated herein by reference.

BACKGROUND OF THE INVENTION

The present invention relates to a semiconductor integrated circuit and, more particularly, to a semiconductor integrated circuit that incorporates a built-in self test circuit of a memory and performs a fault diagnosing operation by using this circuit.

There is a method that detects a defective chip by performing a built-in self test (to be referred to as a BIST hereinafter) by using a BIST circuit incorporated into a semiconductor integrated circuit including a memory, and diagnoses faults in the defective chip by using the BIST circuit, thereby extracting candidates of defective portions of the memory.

Examples of the BIST circuit are a comparator type BIST circuit and compaction type BIST circuit. The comparator type BIST circuit compares an expected value equal to written data with data read out from a memory, and determines the presence/absence of faults. The compaction type BIST circuit compresses data read out from a memory in the BIST circuit, and determines the presence/absence of faults by using the compressed data.

First, the BIST operation of a conventional semiconductor integrated circuit having the comparator type BIST circuit will be described below.

A BIST controller in the BIST circuit controls a data generator, address generator, and control signal generator. A block called a memory collar includes a memory as an object of the BIST together with logic elements necessary for the BIST operation.

The memory receives write data generated by the data generator, address data generated by the address generator, and a control signal generated by the control signal generator. A capture register on the output side of the memory temporarily holds output data from the memory. A comparator compares the output from the capture register with a data expected value generated by the data generator. A flag register holds the comparison result. A result analyzer in the BIST circuit receives the output from the flag register, and outputs the final BIST result.

When one BIST circuit performs the BIST on a plurality of memories, the result analyzer receives individual flag data, checks the overall BIST result, and outputs the final BIST result.

The BIST operation of a conventional semiconductor integrated circuit having the compaction type memory BIST circuit will be described below.

Similar to the semiconductor integrated circuit having the comparator type memory BIST circuit, a BIST controller in the BIST circuit controls a data generator, address generator, and control signal generator. A memory collar includes a memory as an object of the BIST.

The memory receives write data generated by the data generator, address data generated by the address generator, and a control signal generated by the control signal generator.

A compactor receives the output from the memory, and sequentially compresses the input data.

An example of the structure of the compactor is described in non-patent reference 1 (to be described later). An MISR (Multiple Input Signature Register) as a modification of a linear feedback shift register is generally used.

At the end of the BIST, the value saved in the compactor is compared as the BIST result with a precalculated expected value, thereby determining if the memory is fault-free or not.

When diagnosing memory faults by using the BIST circuit in order to extract candidates of fault portions of the memories, output data from a plurality of memories are sequentially serially extracted outside and observed by an external tester.

When using the comparator type BIST circuit described above, capture registers that capture the outputs from memories in individual memory collars and flag registers that receive the outputs from comparators in the memory collars are connected in series. This series circuit, an address register that receives addresses from address generators in the individual BIST circuits, and a flag register of the overall circuit are connected in series, thereby forming one circular shift path as a whole.

This shift path is used to diagnose memories; the shift path shifts and outputs the values of the individual registers in synchronism with the read timing. Since the shift path is circularly formed, the circuit can return to the BIST operation interrupted state at the end of the shift output.

Then, the shift path resumes the BIST, and shifts and outputs the values of the registers at the next read timing. The internal state of the memory can be read out by thus repeating the interruption of the BIST operation, the shift output, and the resumption of the BIST operation. On the basis of the obtained results, a fail bitmap indicating fault bit positions in the cell array of the memory is formed, and faults are analyzed.

In the conventional method as described above, however, all the BIST results must be serially read out, so the outputs from memories that are not objects of the fault diagnosis must also be shifted and output. Accordingly, the BIST time very prolongs if one BIST circuit performs the BIST on many memories.

In addition, when the BIST results are shifted and output, it is necessary to observe the shift outputs and compare them with the expected value by using an external tester. Therefore, the operation is limited by the operating speed of the external tester that is lower than the system operating speed of a semiconductor integrated circuit. This makes it difficult to diagnose a fault at the system operating speed of a semiconductor integrated circuit. Consequently, detectable fault candidates cannot be detected only when the fault diagnosis is performed at the system operating speed.

The reference disclosing the MISR as a modification of a linear feedback shift register is as follows.

Built-In Test for VLSI: Pseudo Random Techniques, Paul H. Bardell, William H. MacAnney and Jacob Savir, John Wiley & Sons, 1987

SUMMARY OF THE INVENTION

According to one aspect of the present invention, there is provided a semiconductor integrated circuit comprising:

a BIST circuit comprising a data generator which generates and outputs write data to be supplied to a memory, an address generator which generates and outputs an address signal to be supplied to said memory, a control signal generator which generates and outputs a control signal for controlling said memory, a result analyzer which receives a flag signal, analyzes a result of a BIST, and outputs a BIST result signal, a BIST controller which controls operations of said data generator, said address generator, said control signal generator, and said result analyzer, and outputs a BIST state signal indicating a state of the BIST, and a diagnostic data storage circuit including a first capture register which captures and outputs, in accordance with a first clock, a latest address signal and the BIST state signal output from said BIST controller while no flag signal is supplied, and maintains outputs when the flag signal is supplied, a storage register which receive and stores the outputs from said first capture register in accordance with a second clock lower in speed than the first clock while no shift enable signal is supplied, thereby storing the address signal and the BIST state signal corresponding to the supply timing of the flag signal, and outputs the stored contents outside by shifting them when the shift enable signal is supplied, and flag suppressing means for comparing the outputs from said first capture register with the stored contents of said storage register, and outputting a flag suppression signal, after the flag signal is supplied, until the latest address signal and the BIST state signal output from said first capture register match the address signal and the BIST control signal stored in said storage register; and a memory collar comprising a memory cell which performs a write operation by receiving the write data, the address signal, and the control signal, and reads out and outputs the written data, in accordance with the first clock, a second capture register which captures latest data output from said memory cell while neither the shift enable signal nor the flag signal is supplied, maintains held contents when the flag signal is supplied, and outputs held contents outside by shifting the held contents when the shift enable signal is supplied, a comparator which compares the output from said second capture register with an expected value, and outputs a comparison result signal meaning failure detection if the output and the expected value do not match, and a flag register which outputs the flag signal on the basis of the comparison result signal while no flag suppression signal is supplied, and suppresses the output of the flag signal when the flag suppression signal is supplied.

According to one aspect of the present invention, there is provided a semiconductor integrated circuit comprising:

a plurality of BIST circuits each comprising a BIST operation configuration register which receives operation configuration data, and sets at least whether the BIST circuit is an object of a BIST, and whether a memory is an object of the BIST, a data generator which generates and outputs write data to be supplied to said memory, an address generator which generates and outputs an address signal to be supplied to said memory, a control signal generator which generates and outputs a control signal for controlling said memory, a result analyzer which receives a flag signal, analyzes a result of the BIST, and outputs a BIST result signal, a BIST controller which controls operations of said data generator, said address generator, said control signal generator, and said result analyzer, and outputs a BIST state signal indicating a state of the BIST, a diagnostic data storage circuit including a first capture register which captures and outputs, in accordance with a first clock, a latest address signal and the BIST state signal output from said BIST controller while no flag signal is supplied, and maintains outputs when the flag signal is supplied, a storage register which receive and stores the outputs from said first capture register in accordance with a second clock lower in speed than the first clock while no shift enable signal is supplied, thereby storing the address signal and the BIST signal corresponding to the supply timing of the flag signal, and outputs the stored contents outside by shifting them when the shift enable signal is supplied, and flag suppressing means for comparing the outputs from said first capture register with the stored contents of said storage register, and outputting a flag suppression signal, after the flag signal is supplied, until the latest address signal and the BIST state signal output from said first capture register match the address signal and the BIST control signal stored in said storage register, and a first multiplexer which selectively outputs one of the stored contents of said storage register and an input signal, in accordance with the contents set in said BIST operation configuration register, said first multiplexers being connected in series; and a plurality of memory collars each comprising a memory cell which performs a write operation by receiving the write data, the address signal, and the control signal, and reads out and outputs the written data, in accordance with the first clock, a second capture register which receives latest data output from said memory cell while neither the shift enable signal nor the flag signal is supplied, maintains held contents when the flag signal is supplied, and outputs held contents outside by shifting the held contents when the shift enable signal is supplied, a comparator which compares the output from said second capture register with an expected value, and outputs a comparison result signal meaning failure detection if the output and the expected value do not match, a flag register which outputs the flag signal on the basis of the comparison result signal while no flag suppression signal is supplied, and suppresses the output of the flag signal when the flag suppression signal is supplied, and a second multiplexer which selectively outputs one of the held contents of said second capture register and the output from said flag register, in accordance with the contents set in said BIST operation configuration register, said second multiplexers being connected in series.

DETAILED DESCRIPTION OF THE INVENTION

Embodiments of the present invention will be explained below with reference to the accompanying drawings.

(1) First Embodiment

Figure 1:
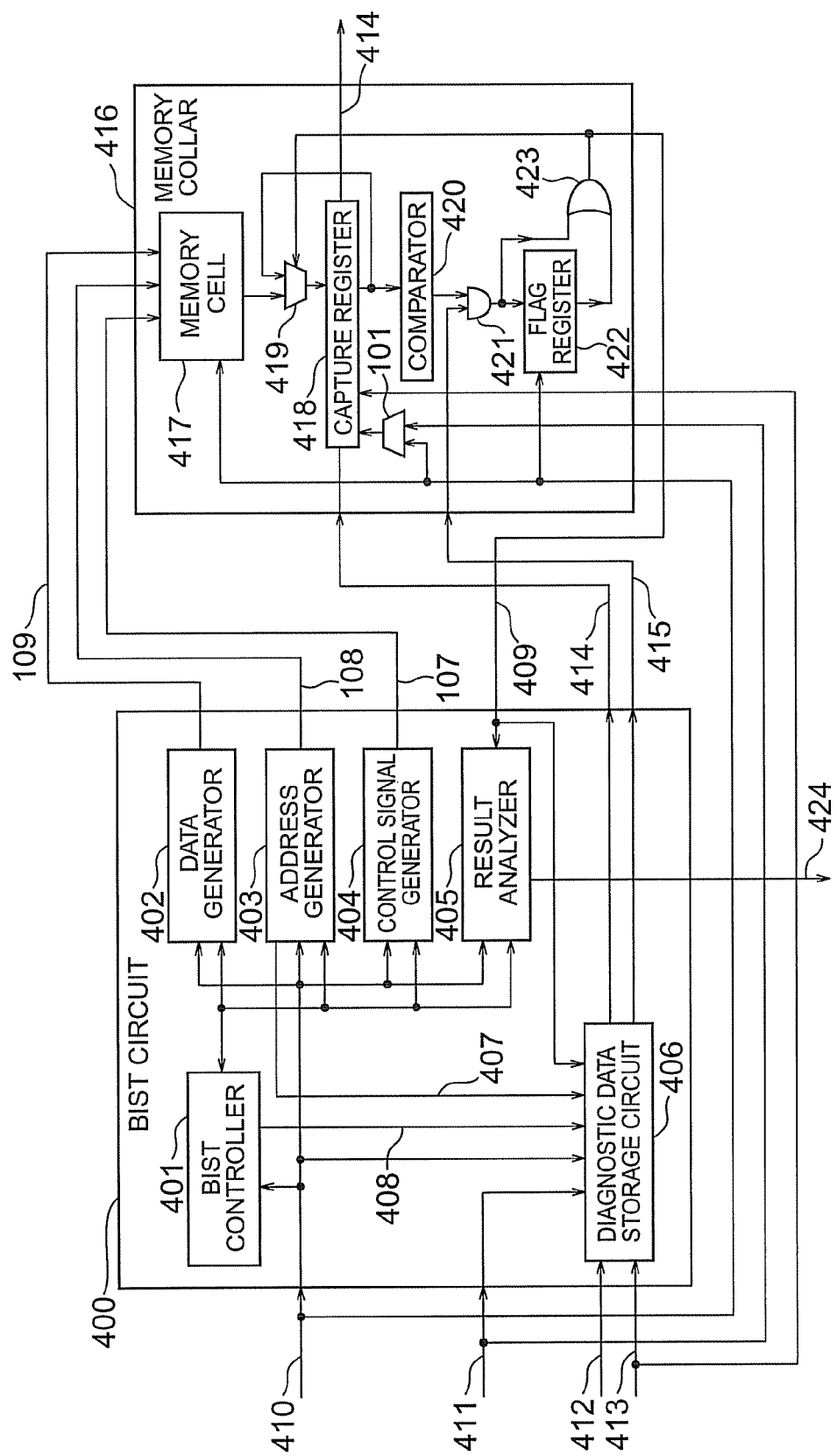
FIG. 1 is a block diagram showing the arrangement of a semiconductor integrated circuit that performs a fault diagnosing operation by using a comparator type BIST circuit according to the first embodiment of the present invention.

FIG. 1 shows the arrangement of a semiconductor integrated circuit according to the first embodiment of the present invention.

This semiconductor integrated circuit includes a BIST circuit 400 and memory collar 416. The BIST circuit 400 has a BIST controller 401, data generator 402, address generator 403, control signal generator 404, result analyzer 405, and diagnostic data storage circuit 406. The first embodiment is characterized in that the BIST circuit 400 has the diagnostic data storage circuit 406.

On the other hand, a block called the memory collar 416 includes a memory cell 417 as an object of a BIST, together with a multiplexer 419, capture register 418, multiplexer 101, comparator 420, AND circuit 421, flag register 422, and OR circuit 423 as elements necessary for a BIST operation.

In the BIST circuit 400, a high-speed clock 410 is input to the BIST controller 401, data generator 402, address generator 403, control signal generator 404, result analyzer 405, and diagnostic data storage circuit 406.

The BIST controller 401 sequentially generates control signals necessary to control the operations of the data generator 402, address generator 403, control signal generator 404, result analyzer 405, and diagnostic data storage circuit 406, and supplies the generated control signals to these units.

The memory cell 417 receives write data 109 generated by the data generator 402, address data 108 generated by the address generator 403, and a memory control signal 107 generated by the control signal generator 404.

In the memory collar 416, the high-speed clock 410 is supplied to the memory cell 417, multiplexer 101, and flag register 422. The multiplexer 101 also receives a low-speed clock 411.

The memory cell 417 receives the write data 109, address data 108, and memory control signal 107, and the data is written in the memory cell 417. Data read out from the memory cell 417 is input to the capture register 418 via the multiplexer 419.

The multiplexer 419 also receives the output from the capture register 418 in addition to the output from the memory cell 417. A flag signal 409 output from the OR circuit 423 and meaning the detection of a failure switches the outputs from the multiplexer 419. Until a failure is detected, the flag signal 409 is logic "0", and the multiplexer 419 directly outputs the data from the memory cell 417. If a failure is detected and the flag signal 409 of logic "1" is supplied to the multiplexer 419, the multiplexer 419 selectively outputs the data from the capture register 418. As a consequence, the capture register 418 maintains the same output.

The capture register 418 normally receives the high-speed clock 410 from the multiplexer 101, and also receives a shift enable signal 413 from the outside. The capture register 418 receives the output data from the multiplexer 419, and outputs the data to the comparator 420 in synchronism with the high-speed clock 410. However, when receiving the shift enable signal 418 from the diagnostic data storage circuit 406 after the BIST is complete, the capture register 418 serially outputs data, that is stored from the multiplexer 101 in synchronism with the low-speed clock 411, to the outside as a serial output signal 414.

When a plurality of memory collars 416 are formed and one BIST circuit 400 controls the BIST operation, capture registers 418 are connected in series and serially output data outside.

The comparator 420 compares the output data from the capture register 418 with a data expected value equal to the write data 109 generated by the data generator 402. The comparator 420 outputs logic "0" while the two values are equal, and logic "1" if the two values are not equal, i.e., if a failure is detected, as a comparison result signal. The flag register 422 receives and holds this comparison result signal via the AND circuit 421.

Since no failure is detected at the start of the BIST as will be described later, the diagnostic data storage circuit 406 supplies a flag suppression signal 415 of logic "1" to the AND circuit 421, and the AND circuit 421 directly outputs the comparison result signal from the comparator 420.

If a failure is detected and the BIST is resumed from a point before that, however, the diagnostic data storage circuit 406 outputs the flag suppression signal 415 of logic "0" to the AND circuit 421 before the BIST reaches the failure portion. Accordingly, the AND circuit 421 keeps outputting logic "0" data without outputting the comparison result signal from the comparator 420.

The OR circuit 423 receives the input signal to the flag register 422 and the output signal from it. Consequently, if a failure is detected, more specifically, if the comparator 420 outputs a comparison result signal meaning the detection of a failure when no failure is detected at the start of the BIST, or if the BIST is resumed after a failure is detected, the AND circuit 421 receives the failure suppression signal 415 and does not output the comparison result signal meaning a failure. However, if a flag of logic "1" is held in the flag register 422 because a failure is detected before that, the OR circuit 423 outputs the flag signal 409. Note that when the BIST is resumed, the flag register 422 is initialized to logic "0".

When receiving the flag signal 409, the multiplexer 419 keeps holding the output from the capture register 418 as described above.

Also, the flag register 422 outputs the flag signal 409 to the result analyzer 405 in the BIST circuit 400.

When performing the BIST on a plurality of memory cells by using one BIST circuit 400, as described above, memory collars 416 having the above arrangement are arranged in one-to-one correspondence with these memory cells, and the flag signals 409 output from the flag registers 422 of the memory collars 416 are input together to the result analyzer 405.

The result analyzer 405 checks the overall BIST result, and outputs a final BIST result signal 424 to an external tester.

The flag signal 409 output from the OR circuit 423 is also input to the diagnostic data storage circuit 406. If a failure is detected and the flag signal 409 is generated, the diagnostic data storage circuit 406 receives information indicating the occurrence of the failure.

In this manner, the BIST operation using the BIST circuit is performed, and the checks if each memory cell 417 is fault-free.

Figure 2:
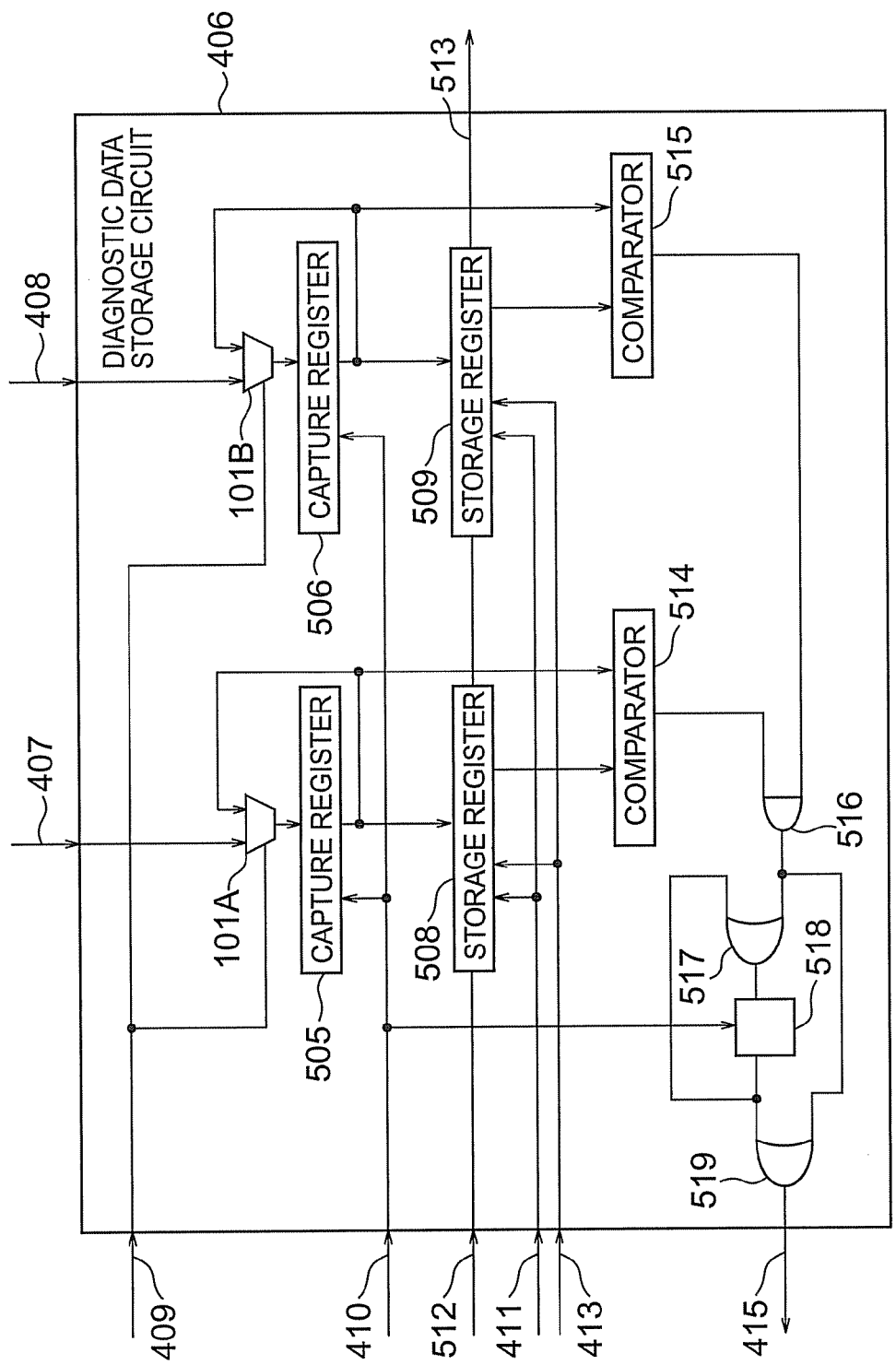
FIG. 2 is a block diagram showing the arrangement of a diagnostic data storage circuit of the semiconductor integrated circuit.

Subsequently, a fault diagnosis is performed using the BIST circuit. FIG. 2 shows details of the circuit configuration of the diagnostic data storage circuit 406.

The diagnostic data storage circuit 406 has multiplexers 101A and 101B, capture registers 505 and 506, storage registers 508 and 509, comparators 514 and 515, an AND circuit 516, OR circuits 517 and 519, and a flag suppression signal register 518, for an address signal 407 and BIST state signal 408.

The capture registers 505 and 506 respectively capture, in synchronism with the high-speed clock 410, the current address signal 407 generated by the address generator 403 and the current BIST state signal 408 output from the BIST controller 401, via the multiplexers 101A and 101B. The BIST state signal 408 indicates the present position in the BIST sequence while the BIST is currently being executed.

The multiplexers 101A and 101B respectively receive the outputs from the capture registers 505 and 506, in addition to the address signal 407 and BIST state signal 408. The multiplexers 101A and 101B each selectively output one signal in accordance with the flag signal 409.

If no failure is detected and the flag signal 409 is logic "0", the multiplexers 101A and 101B respectively output the address signal 407 and BIST state signal 408 to the capture registers 505 and 506.

If a failure is detected and the flag signal 409 changes to logic "1", the multiplexers 101A and 101B each selectively output the data from the corresponding one of the capture registers 505 and 506, so the capture registers 505 and 506 each maintain the present holding state. Accordingly, the capture registers 505 and 506 do not update their contents even when the multiplexers 101A and 101B receive the new address signal 407 and BIST state signal 408, respectively.

The storage registers 508 and 509 having the same bit width as the capture registers 505 and 506 respectively receive the outputs from the capture registers 505 and 506, in synchronism with the low-speed clock 411.

The output terminal of the storage register 508 is connected in series with the input terminal of the storage register 509. When a plurality of BIST circuits are connected, the input terminal of the storage register 508 is connected in series with the output terminal of the storage register 509 in the diagnostic data storage circuit 406 in a preceding stage (not shown), or connected in series with a shift input terminal if the storage register 508 is in the first stage as a unit of the BIST, and receives a shift input signal 512. Likewise, the output terminal of the storage register 509 is connected in series with the input terminal of the storage register 508 in the diagnostic data storage circuit 406 in a succeeding stage (not shown), and outputs a shift output signal 513. The shift output signal 513 is connected to the BIST circuit of the next group. In the final stage as a unit of the group, an external tester installed outside the device observes the shift output signal 513, and extracts a candidate of a fault portion found by the fault diagnosis.

The capture registers 505 and 506 capture, hold, and output data in synchronism with the high-speed clock 410, so as to operate at the same speed as the memory cell 417. However, the storage registers 508 and 509 capture, hold, and output data in synchronism with the low-speed clock 411 for the reason explained below. That is, the outputs from the storage registers 508 and 509 are observed by an external tester after they are shifted as described above. If the speed is too high, the external tester cannot observe the outputs any longer. Therefore, the operating speed is matched with that of the external tester which operates at a speed lower than that of the memory cell 417.

Also, the capture registers 505 and 506 receive new data and update the held contents until a failure occurs and the flag signal 409 is output. When the flag signal 409 is output to the multiplexers 101A and 101B, the capture registers 505 and 506 hold their own outputs as described above. If a failure is detected and the BIST is resumed from a point traced back from the failure portion, the capture registers 505 and 506 maintain the held contents while the flag is suppressed before the BIST reaches the failure portion.

If the shift enable signal 413 is logic "0", the storage registers 508 and 509 respectively receive and hold the outputs from the capture registers 505 and 506, and output the data to the comparators 514 and 515 in synchronism with the low-speed clock 411.

If the shift enable signal 413 changes to logic "1", the operation proceeds to a shift mode. The output from the storage register 508 having received the shift input signal 512 is output as the shift output signal 513 from the capture register 506, thereby forming a shift register. Consequently, the data from a memory cell in which a defect is detected can be output to an external tester after the BIST is interrupted.

When the BIST operation is resumed after being temporarily stopped because a failure is detected during the BIST, the shift enable signal 413 changes to logic "0". Therefore, the output data from the capture registers 505 and 506 are transferred to and held in the storage registers 508 and 509, and output to the comparators 514 and 515, respectively.

The flag signal 409 is logic "1" at this failure detection point, but changes to logic "0" after the BIST is resumed. Accordingly, the capture registers 505 and 506 respectively capture and hold the address signal 407 and BIST state signal 408 via the multiplexers 101A and 101B again.

The comparators 514 and 515 respectively compare the held contents of the capture registers 505 and 506 with the held contents of the storage registers 508 and 509.

If both the contents are equal and both the comparators 514 and 515 output logic "1", i.e., if a failure is detected and the BIST has reached this failure portion after being resumed from a point before the failure portion, the output from the AND circuit 516 changes to logic "1". The OR circuit 517 outputs logic "1", and the output value from the comparison state register (flag suppression signal register) 518 changes to logic "1" for the first time.

Similar to the capture registers 505 and 506, the storage registers 508 and 509 receive new data and update the held contents until a failure is detected. If a failure is detected, however, the storage registers 508 and 509 switch to the shift mode in response to the externally input shift enable signal 413, and operate as a shift register to output a shift output signal 513. This destroys the held contents of the storage registers 508 and 509.

Then, the storage registers 508 and 509 respectively receive and hold the outputs from the capture registers 505 and 506 once. After that, the storage registers 508 and 509 keep holding the contents and do not receive any outputs from the capture registers 505 and 506. That is, the storage registers 508 and 509 respectively hold the address signal 407 and BIST state signal 408 corresponding to the failure detection timing.

Logic "1" from the comparison state register 518 is output as the flag suppression signal 415 via the OR circuit 519, and supplied to the AND circuit 421 in the memory collar 416. When the BIST is resumed, the comparison state register 518 is initialized to hold logic "0", and set in a suppressed state.

When the OR circuit 517, comparison register 518, and OR circuit 519 output the flag suppression signal 415 of logic "1" from the AND circuit 516, the OR circuit 519 keeps outputting logic "1" after that.

On the other hand, if the output from the comparator 420 changes to logic "1" in the memory collar 416, the AND circuit 421 receives this logic "1" together with logic "1" of the flag suppression signal 415, and outputs logic "1".

After that, the flag signal 409 from the OR circuit 423 maintains logic "1", and this value is input to the control terminal concerning output switching of the multiplexer 419. Accordingly, the input terminal of the capture register 418 receives its own output by feedback, rather than the output supplied from the memory cell 417 via the multiplexer 419. As a consequence, the capture register 418 holds the current value.

While the flag suppression signal 415 from the diagnostic data storage circuit 406 in the BIST circuit 400 is logic "0", however, the output from the AND circuit 421 is logic "0", and the input to the flag register 422 maintains logic "0". Even if the output from the memory cell 417 contains failures, therefore, the input to the flag register 422 does not change to logic "1", so data capturing is not suppressed and the BIST execution is continued.

Accordingly, if failures are detected a plurality of number of times and the BIST is interrupted whenever a failure is detected and resumed before the failure portion, the BIST can be advanced to the latest failure portion without outputting the flag signal 409 again with respect to any already detected old failure.

While the BIST is being executed, the capture register 418 operates by the high-speed clock 410 equal to the high-speed BIST clock. This makes it possible to execute the BIST at a high-speed clock generated by an on-chip clock generator or the like.

If the BIST operation is interrupted, the multiplexer 101 in the memory collar 416 selectively outputs the low-speed clock 411 directly controllable by the BIST circuit 400 to the capture register 418, and the capture register 418 operates by this clock.

The low-speed clock 411 is the same as the clock supplied to the storage registers 508 and 509 in the diagnostic data storage circuit 406 shown in FIG. 2, and supplied from the same clock source.

In the shift mode as described above, the storage registers 508 and 509 form a shift register. In this case, the storage register 509 outputs the shift output signal 513 as the serial output signal 414 to the capture register 418. If a failure is detected, therefore, an external tester can receive and observe the address signal 407 and BIST state signal 408 from the BIST controller 401 and the output from the memory cell 417.

Note that when performing the BIST on a plurality of memory cells 417 by one BIST circuit 400, the capture registers 418 in the memory collars 416 formed in one-to-one correspondence with the memory cells 417 are connected in series to form a shift register.

Figure 3:
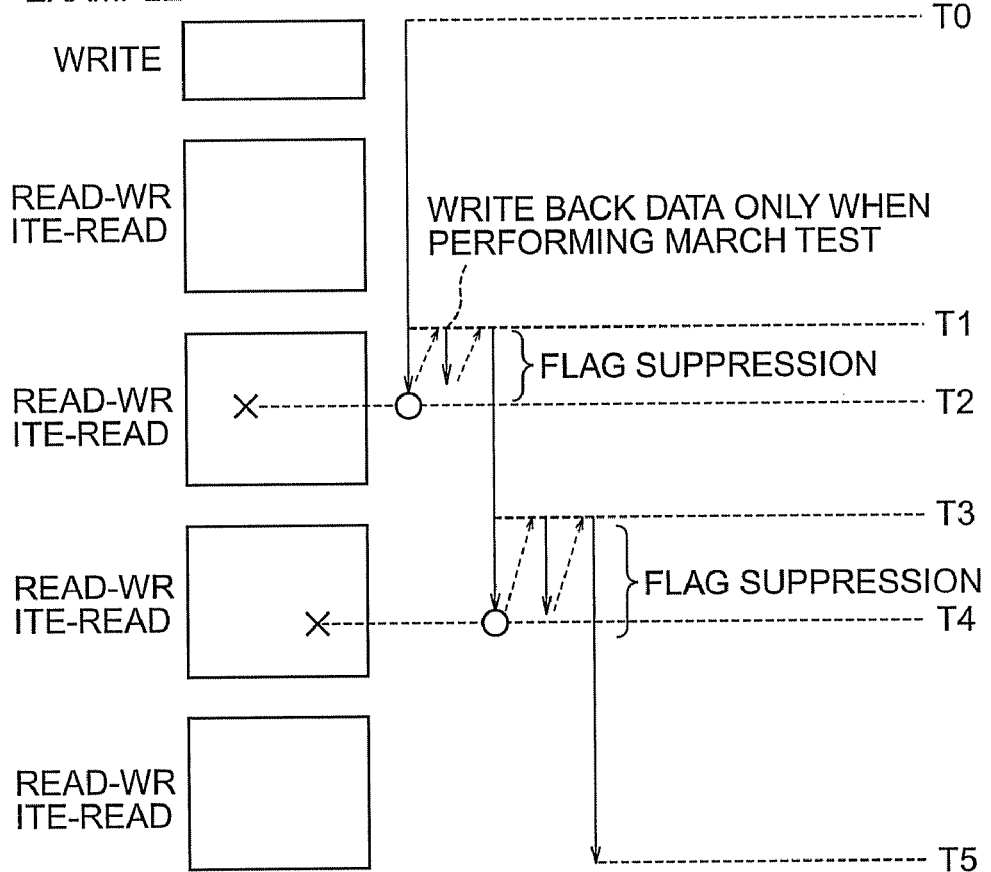
FIG. 3 is a view for explaining the procedure of a memory fault diagnosis performed in the semiconductor integrated circuit.

FIG. 3 shows the procedure of executing the BIST in the first embodiment. Assume that the BIST circuit 400 performs a BIST called a marching pattern named 13N.

The marching pattern is a pattern by which, for example, a group of operations (march element r0w1r1) of reading out logic "0" from a memory in a logic "0" state, writing logic "1", and reading out logic "1" is sequentially executed for all addresses. This pattern switches the memory state from logic "0" to logic "1".

On the other hand, a walking pattern is a pattern using a march element (r0w1r1w0) that reads out logic "0" from a memory in a logic "0" state, writes logic "1", reads out logic "1", and writes logic "0". This pattern maintains the memory state in logic "0".

First, a BIST operation is started as (WRITE operation) from time T0, and a predetermined data pattern (e.g., data having logic "0" in all bits, or checkerboard pattern data) is written in all addresses of the memory cell 417.

As (READ-WRITE-READ operation), read of a normal data pattern (e.g., "1010") and write of an inverted pattern (e.g., "0101") are performed at each address in ascending order of address. Then, read of the inverted data pattern and write of the normal data pattern are performed at each address in ascending order of address.

In addition, read of the normal data pattern and write of the inverted pattern are performed at each address in descending order of address. Subsequently, read of the inverted data pattern and write of the normal data pattern are performed at each address in descending order of address.

If a first failure is detected at time T2, the BIST operation is interrupted. The BIST controller 401 outputs the BIST state signal 408, address signal 407, and serial output data 414 (shift output data 513) corresponding to time T2 to an external tester. The storage registers 508 and 509 respectively store the data of an address where the first failure is detected, and the BIST state signal indicating the present position in the BIST.

After that, the BIST operation is resumed. However, the BIST operation is resumed not from time T2 as the point of interruption but from time T1 by tracing back predetermined steps. This is so because if the BIST operation is resumed from the interruption point (time T2), a shift operation is inserted between adjacent operations, and this makes the BIST impossible to perform at the system operating speed.

The point (time T1) to be traced can be a break of the marching operation, or a point obtained by tracing back predetermined addresses from the interruption point. It is also possible to switch these points, or externally set the number of addresses to be traced before the start of the BIST. In the example shown in FIG. 3, the operation traces back to time T1 as a break of the marching operation.

Note that when the BIST currently being executed is marching, data at the address at the traced point (time T1) is already rewritten with different data in which the normal pattern and inverted pattern are switched, so no correct operation is performed in the marching test that performs a read operation based on the state before the rewrite.

Accordingly, the first embodiment inserts an operation of writing back data from the point (time T1) obtained by tracing back addresses to the point (time T2) of interruption.

On the other hand, the walking test that advances the BIST while maintaining data in the original state does not rewrite the data. Therefore, no write back operation is necessary, so the BIST can be resumed immediately from the traced point.

The first embodiment performs data write back between times T1 and T2, and resumes the BIST operation after returning to time T1.

When the BIST is executed for the second time, the flag suppression signal 415 is output from time T1 to time T2. Even if a failure is detected again at time T2, therefore, the flag signal 409 is not output because the flag is suppressed, so the event is not regarded as failure detection.

When the second BIST is executed, the capture registers 505 and 506 respectively store the address data 407 and BIST state signal 408. This information is compared with the address data 407 and BIST state signal 408 obtained when the failure is detected by the first BIST and respectively stored in the storage registers 508 and 509. This reveals that time T2 at which the first failure is detected is reached. The flag is suppressed until time T2.

After that, the BIST operation advances to time T4 as a next failure portion. At time T4, the BIST operation is interrupted, and data is output as the serial output signal 414 (shift output signal 513) together with the address signal 407 and BIST state signal 408. Subsequently, similar to the case at time T1, the BIST is resumed from time T3 of data write back.

If no new defect is detected after that, the BIST operation terminates at time T5. An external tester stores the failure information obtained at times T2 and T4.

Figure 4:
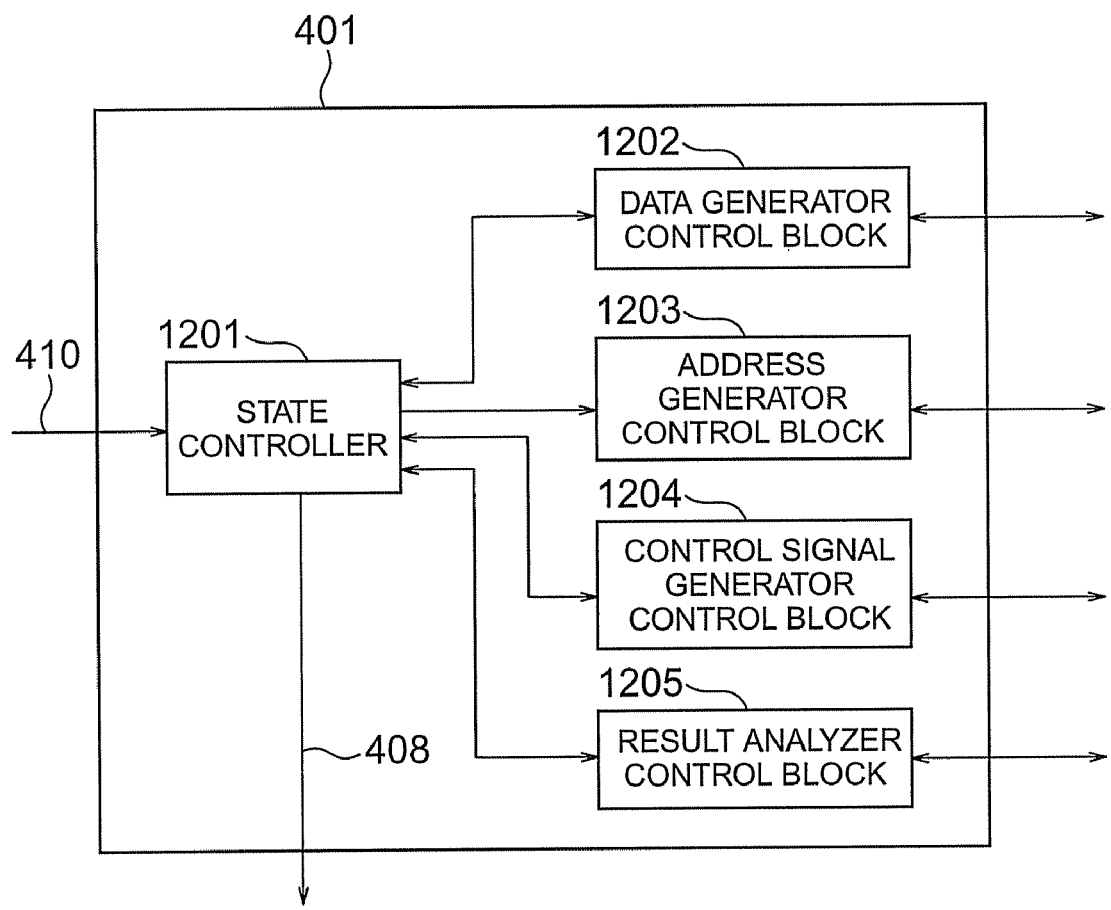
FIG. 4 is a block diagram showing the arrangement of a state controller included in a BIST controller of the semiconductor integrated circuit.

FIG. 4 shows the inner arrangement of the BIST controller 401. The BIST controller 401 includes a state controller 1201, data generator control block 1202, address generator control block 1203, control signal generator control block 1204, and result analyzer control block 1205.

The state controller 1201 controls the transition of the BIST state, i.e., the BIST sequence. The state controller 1201 outputs the BIST state signal 408 indicating the present state of the state controller 1201 to the diagnostic data storage circuit 406.

The data generator control block 1202 monitors the state of the data generator 402 and controls its oncoming operation.

The address generator control block 1203 monitors the state of the address generator 403 and controls its oncoming operation.

The control signal generator control block 1204 monitors the state of the control signal generator 404 and controls its oncoming operation.

The result analyzer control block 1205 monitors the state of the result analyzer 405 and controls its oncoming operation.

Figure 5:
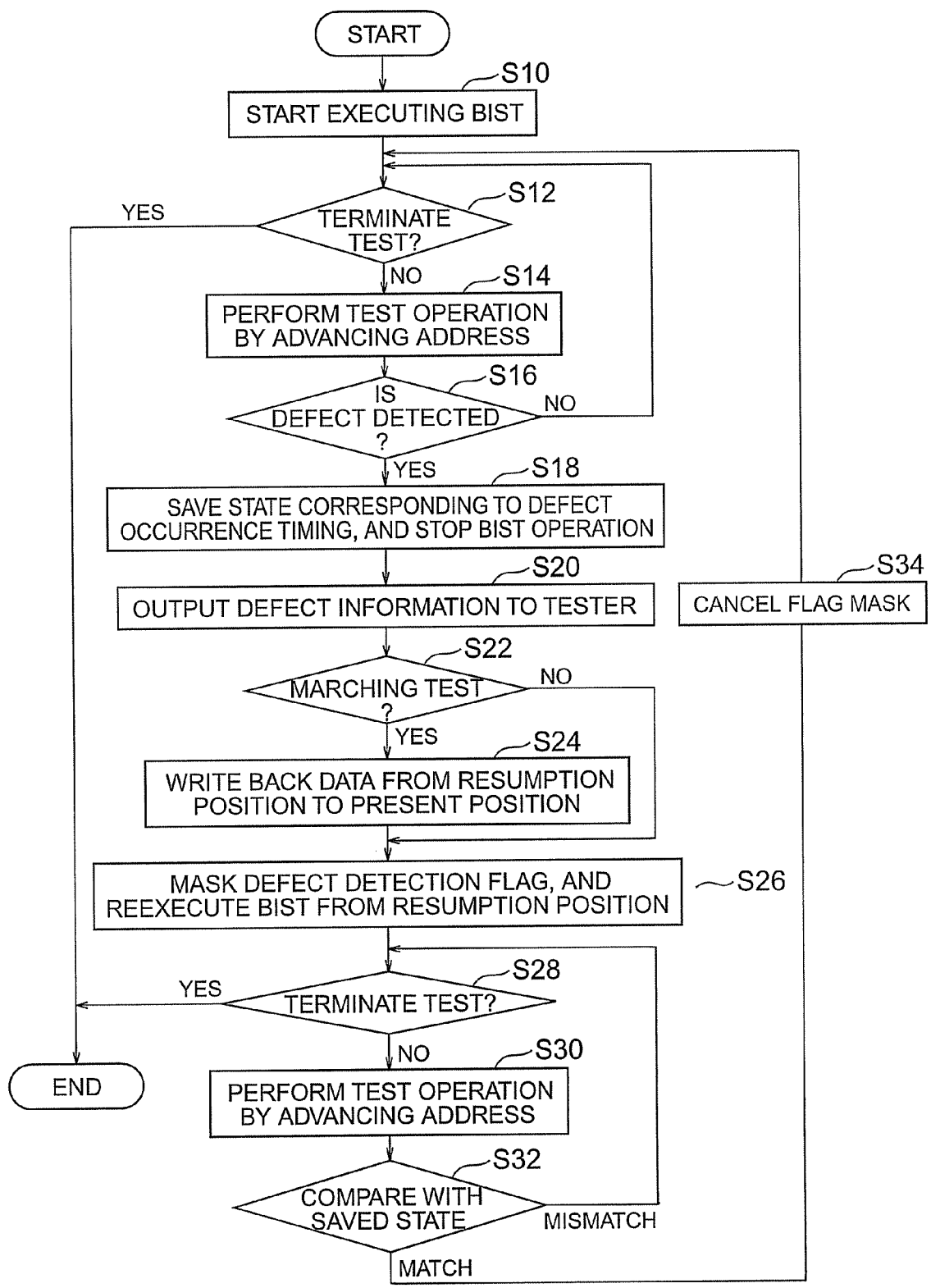
FIG. 5 is a flowchart showing the operation procedure of the state controller.

FIG. 5 shows the operation sequence of the BIST controller 401. The state controller 1201 performs the following control operation.

First, in step S10, the state controller 1201 starts executing the BIST.

In step S12, the state controller 1201 determines whether to terminate the BIST. If YES in step S12, the state controller 1201 immediately terminates the BIST. If NO in step S12, the process advances to step S14.

In step S14, the state controller 1201 continues the BIST operation by advancing the address.

In step S16, the state controller 1201 determines the presence/absence of defect detection. If no defect is detected, the process returns to step S12. If a defect is detected, the process advances to step S18.

In step S18, the state controller 1201 saves the state when the defect has occurred, and stops the BIST operation.

In step S20, the state controller 1201 outputs the defect state to an external tester.

In step S22, the state controller 1201 determines whether the performed BIST is a marching test. If the BIST is not a marching test, i.e., if the BIST is a walking test, the process advances to step S26. If the BIST is a marching test, the process advances to step S24.

In step S24, the state controller 1201 writes back data from the BIST resumption position to the present defect detection position.

In step S28, the state controller 1201 determines whether to terminate the BIST. If YES in step S28, the state controller 1201 immediately terminates the BIST. If NO in step S28, the process advances to step S30, and the state controller 1201 continues the BIST by advancing the address.

In step S32, the state controller 1201 compares the state (address) corresponding to the defect occurrence point and saved in step S18 with the present state. If the two states are equal, the process returns to step S12, and the state controller 1201 repeats the same operation. If the two states are not equal, the process returns to step S28.

The first embodiment performs the BIST operation by using the BIST circuit, and then performs the fault diagnosing operation by using the BIST circuit. The first embodiment stores, in the registers, data read out from the memory when a failure is detected and the result of comparison with the expected value. If a failure is detected, the first embodiment interrupts the BIST operation, and serially outputs data read out from only a memory as an object of the fault diagnosis to the outside, but does not output any data from a memory that is not an object of the diagnosis. The first embodiment resumes the BIST operation from the resumption point traced back from the interruption point, passes a failure portion detected before that without outputting any failure detection flag again, and advances the fault diagnosis to the interruption point and after that.

As described above, the first embodiment does not resume the BIST by tracing back to the start point of the test whenever a failure is detected, but resumes the BIST by tracing back only a necessary amount. This makes it possible to efficiently obtain all pieces of defect information in a memory cell.

Also, the first embodiment outputs data from a memory only when a new failure is detected. This reduces the time required for the fault diagnosis.

In addition, unlike in the conventional method that serially outputs all data including those from memories that are not objects of the fault diagnosis to the outside, the first embodiment extracts only outputs from a memory that is an object of the fault diagnosis, thereby shortening the time necessary for the fault diagnosis. The necessary time can be greatly reduced especially when the number of memories is large.

Furthermore, the first embodiment performs the BIST by using a high-speed clock used in the normal operation of a memory, and uses a low-speed clock at which an external tester can operate when outputting the BIST results outside by shifting them. Accordingly, the first embodiment can perform the BIST in a system operation. This makes it possible to acquire information of a failure that occurs only in a at-speed test.

REFERENCE EXAMPLE 1

Figure 6:
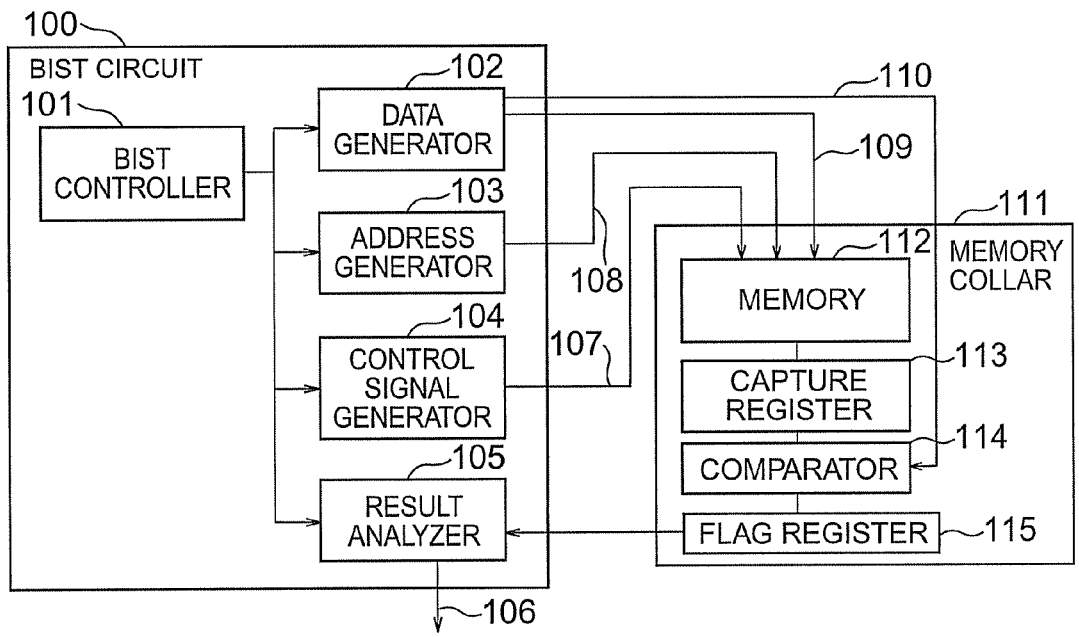
FIG. 6 is a block diagram showing the arrangement of a semiconductor integrated circuit that performs a BIST operation by using a comparator type BIST circuit according to reference example 1.

FIG. 6 shows the arrangement of a semiconductor integrated circuit that performs a BIST operation by using a comparator type memory BIST circuit according to reference example 1.

A BIST controller 101 in a BIST circuit 100 sequentially generates and outputs control signals necessary to control a data generator 102, address generator 103, and control signal generator 104.

A block called a memory collar 111 contains a memory 112 as an object of the BIST, in addition to a capture register 113, comparator 114, and flag register 115 as logic elements necessary for the BIST operation.

The memory 112 receives write data 109 and an expected value 110 generated by the data generator 102, address data 108 generated by the address generator 103, and a control signal 107 generated by the control signal generator 104.

The capture register 113 receives the output from the memory 112. The comparator 114 compares the output from the capture register 113 with the data expected value 110 generated by the data generator 102. The flag register 115 holds the comparison result.

A result analyzer 105 of the BIST circuit 100 receives the output from the flag register 115, and outputs the final BIST result as a BIST result output 106.

When performing the BIST on a plurality of memories by using one BIST circuit 100, the result analyzer 105 of the BIST circuit 100 receives the outputs from flag registers in memory collars formed in one-to-one correspondence with the memories. The result analyzer 105 checks the result of the overall fault diagnosis, and outputs the result as the BIST result signal 106.

REFERENCE EXAMPLE 2

Figure 7:
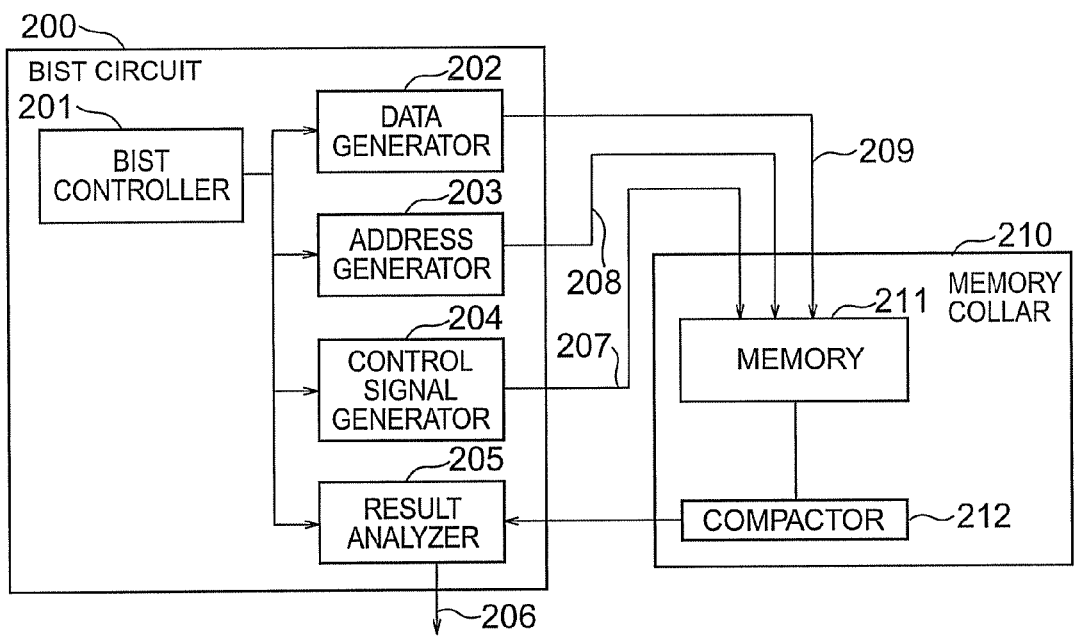
FIG. 7 is a block diagram showing the arrangement of a semiconductor integrated circuit that performs a BIST operation by using a compaction type BIST circuit according to reference example 2.

FIG. 7 shows the arrangement of a semiconductor integrated circuit that performs a BIST by using a compaction type memory BIST circuit according to reference example 2.

A BIST controller 201 in a BIST circuit 200 sequentially generates and outputs control signals necessary to control a data generator 202, address generator 203, control signal generator 204, and result analyzer 205. A memory collar 210 includes a memory 211 as an object of the BIST, in addition to a compactor 212.

The memory 211 receives write data 209 generated by the data generator 202, address data 208 generated by the address generator 203, and a control signal 207 generated by the control signal generator 204. The compactor 212 receives the output from the memory 211, and sequentially compresses and outputs the data.

The result analyzer 205 compares the value saved in the compactor 212 at the end of the BIST with an expected value to check the result of the BIST, and outputs the result as a determination result 206.

When performing the BIST on a plurality of memories by using one BIST circuit 200, a plurality of compactors included in memory collars formed in one-to-one correspondence with the memories are connected in series, and transfer data to the result analyzer 106 in the BIST circuit 200, thereby executing the BIST.

When specifying the bit position of a memory fault portion by using the BIST circuit 100 according to reference example 1, the output from the memory 211 is serially observed at the read timing of the BIST circuit 200. This case will be described below.

Figure 8:
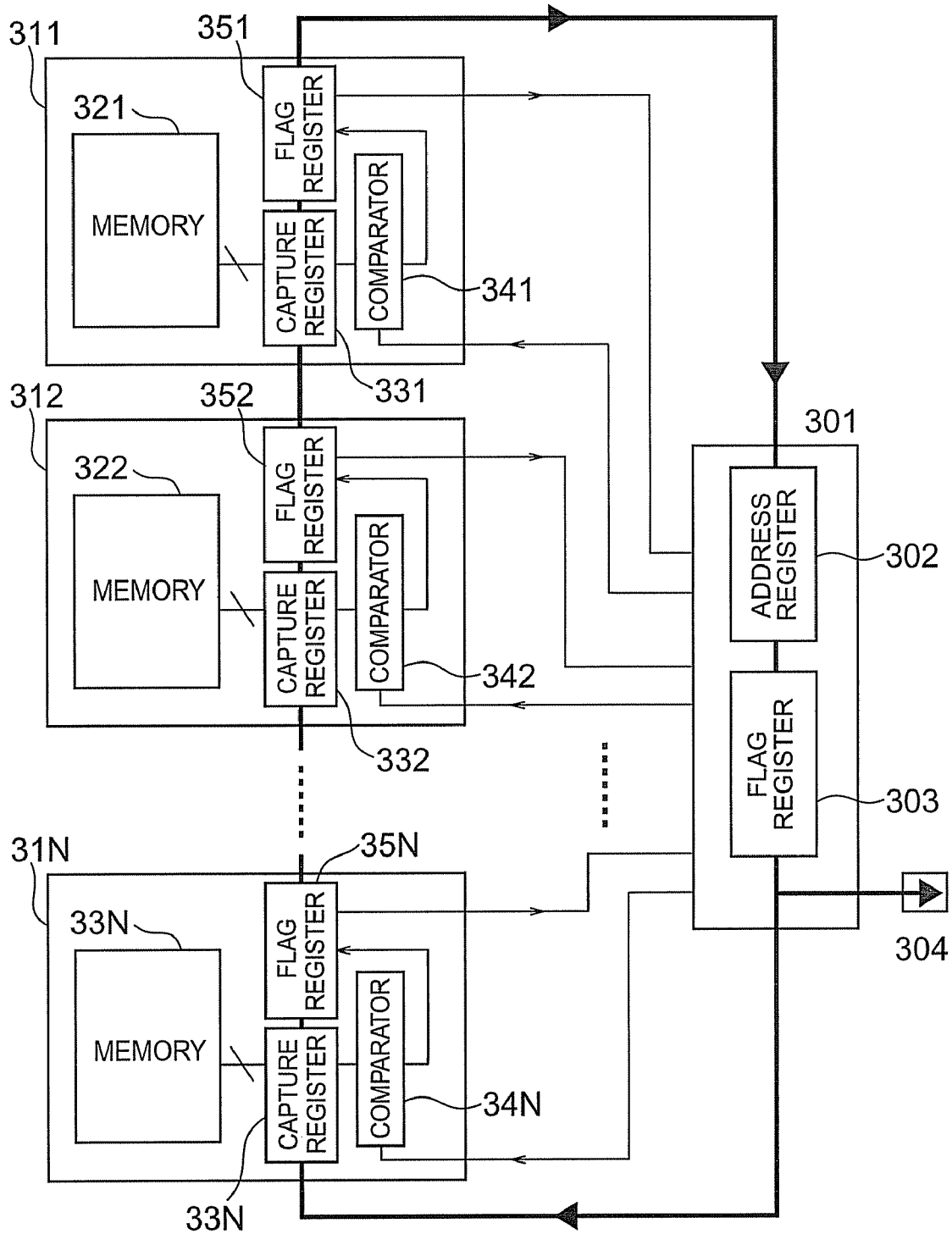
FIG. 8 is a block diagram showing an arrangement when performing a fault diagnosing operation by using the semiconductor integrated circuit according to reference example 1.

As shown in FIG. 8, capture registers 331, 332, ..., 33N (N is an integer of 2 or more) that capture outputs from memories 321, 322, ..., 32N in memory collars 311, 312, ..., 31N and flag registers 351, 352, ..., 35N that receive outputs from comparators 341, 342, ..., 34N are connected in series. This series circuit forms one circular shift path as a whole together with an address register in an address generator 302 and a flag register 303 included in a BIST controller 301 in the BIST circuit.

This shift path is used to shift and output the values of the capture registers 331 to 33N outside at the read timing via an external output terminal 304. Since the shift path is circularly formed, after this shift output is complete the circuit can return to the state when the BIST operation is interrupted.

The BIST is then resumed, and the values of the capture registers 331 to 33N are shifted and output again at the read timing. The internal states of the memories 321 to 32N can be read out by repeating the BIST operation interruption, shift output, and BIST operation resumption.

In this case, however, data of capture registers output from memories that are not objects of the fault diagnosis must also be shifted and output. This very prolongs the fault diagnosing time. In addition, an external tester must be used to observe the shift-output data and compares the data with the expected value. Accordingly, the operating speed of the tester imposes limitations on the operation. This makes it impossible to diagnose a fault at the system operating speed of a memory, and sometimes makes it impossible to defect a failure that can be observed at only the system operating speed.

By contrast, the first embodiment as described above can reduce the time by shifting and outputting, to the outside, only the data from a memory as an object of the fault diagnosis. It is also possible to diagnose a fault at the system operating speed.

REFERENCE EXAMPLE 3

Figure 9:
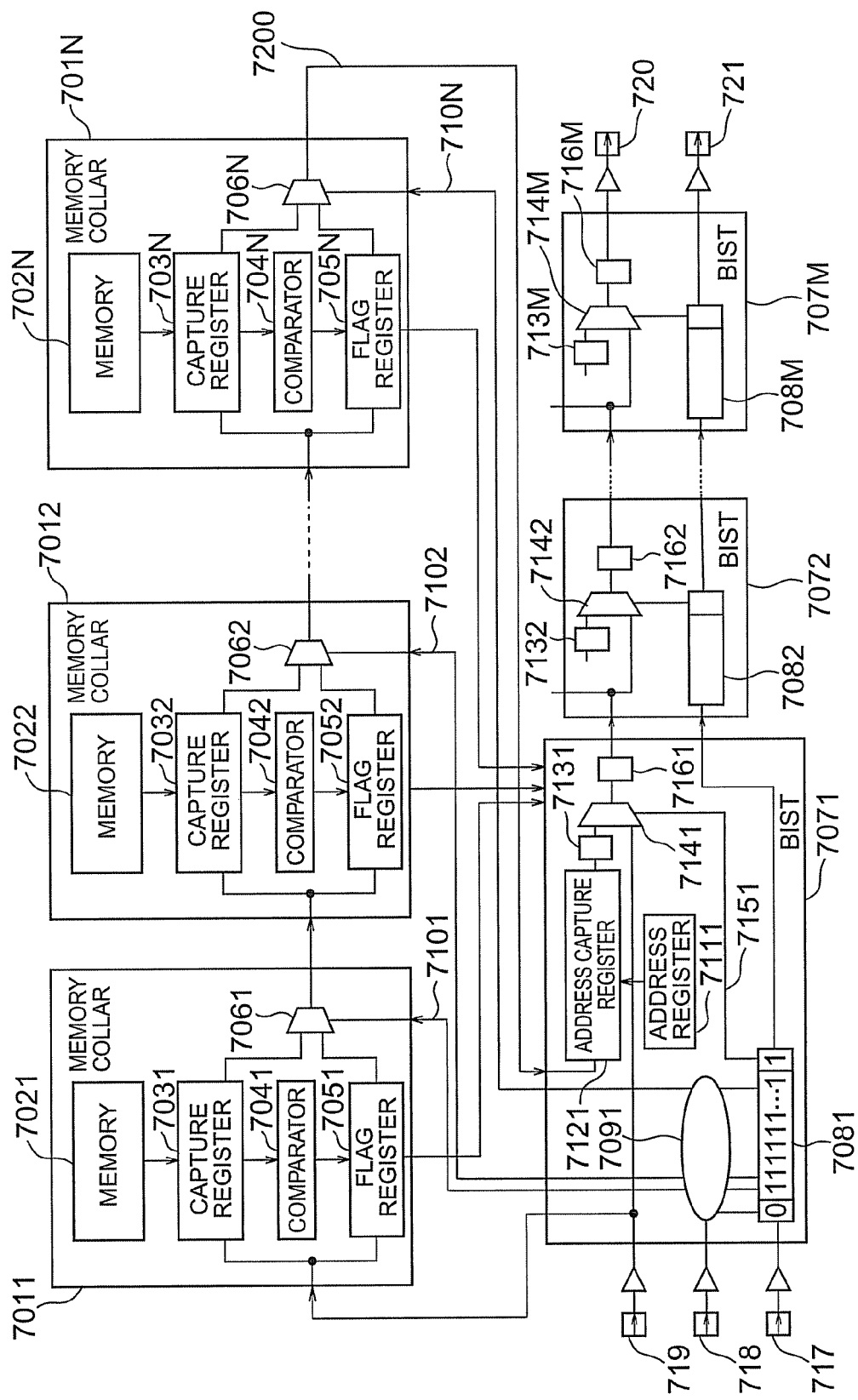
FIG. 9 is a block diagram showing the arrangement of a semiconductor integrated circuit that performs a fault diagnosing operation by using a BIST circuit according to reference example 3.

A semiconductor integrated circuit that diagnoses a fault by using a BIST circuit according to reference example 3 will be explained below with reference to FIG. 9 showing the arrangement of the semiconductor integrated circuit.

This semiconductor integrated circuit comprises a set of N memory collars 7011 to 701N, a BIST circuit 7071 that executes a BIST on the memory collars 7011 to 701N, A (A is an integer of 1 or more) memory collars (not shown), a BIST circuit 7072 that executes the BIST on the A memory collars, B (B is an integer of 1 or more) memory collars (not shown), a BIST circuit 7073 that executes the BIST on the B memory collars, ..., C (C is an integer of 1 or more) memory collars (not shown), a BIST circuit 707M that executes the BIST on the C memory collars, an input terminal 717 that receives an operation configuration bit string serial signal, an input terminal 718 that receives a memory selection signal, an input terminal 719 that receives shift path serial data, an output terminal 720 that outputs serial data, and an output terminal 721 that outputs operation configuration bit string serial data.

The memory collars 7011 to 701N have the same arrangement, i.e., have memories 7021 to 702N, capture registers 7031 to 703N, comparators 7041 to 704N, and flag registers 7051 to 705N.

The (M-1) sets of memory collars (not shown) on which the BIST circuits 7072 to 707M execute the BIST also have the same arrangement as above, so an explanation will not be repeated.

In the memory collar 7011, the capture register 7031 captures the output from the memory 7021, the comparator 7041 compares the output with an expected value, and the flag register 7051 holds the comparison result. A multiplexer 7061 and the BIST circuit 7071 receive the held contents.

Unlike in the first embodiment described above, the capture register 7031 and flag register 7051 in the memory collar 7011 are connected not in series but in parallel, and the multiplexer 7061 for switching outputs switches the outputs from the capture register 7031 and flag register 7051.

The BIST circuit 7071 has an address capture register 7121, address register 7111, end flag register 7131, BIST configuration decoder 7091, BIST operation configuration register 7081, multiplexer 7141, and determination flag register 7161. The BIST circuits 7072 to 707M also have the same arrangement, so a repetitive explanation will be omitted.

The BIST operation configuration register 7081 receives operation configuration bit string serial data from the outside via the input terminal 717, thereby setting the operation. The BIST operation configuration registers 7081 to 708M in the BIST circuits 7071 to 707M are connected in series. This makes it possible to minimize the number of external terminals necessary for operation configuration.

Figure 10:
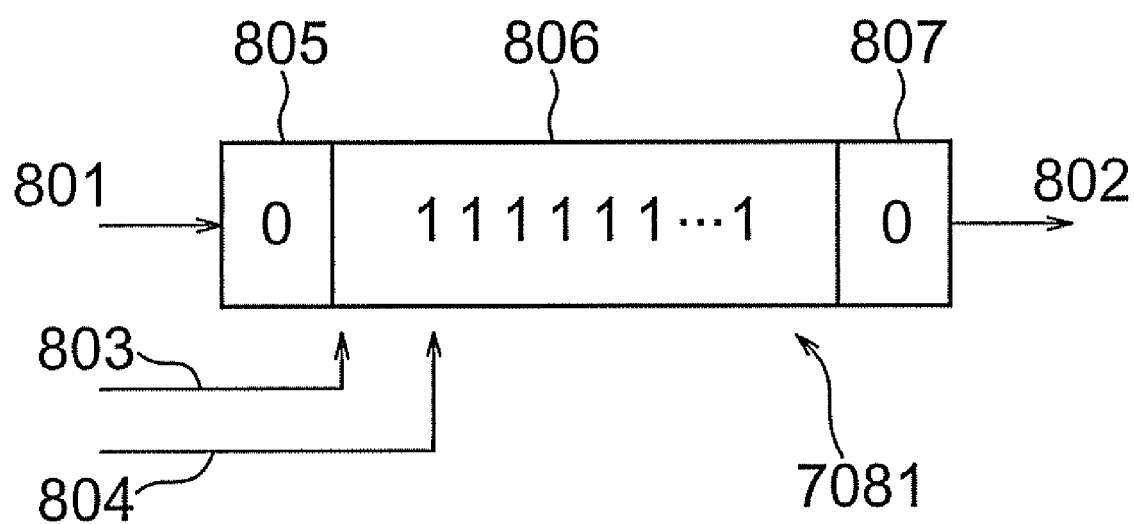
FIG. 10 is a view for explaining the arrangement of a BIST operation configuration register in the semiconductor integrated circuit.

FIG. 10 shows the arrangement of the BIST operation configuration register 7081 as an example of the BIST operation configuration registers 7081 to 708M. The BIST operation configuration register 7081 has a shift register configuration in which data is sequentially shifted and transferred from an input terminal 801 to an output terminal 802. The input terminal 801 receives the operation configuration bit string serial data input from the input terminal 717. The BIST operation configuration register 7081 enters a shift enable state upon receiving a shift enable signal 803, and sequentially performs a shift operation in synchronism with a shift clock 804.

The BIST operation configuration register 7081 has an operation mode configuration bit 805, memory selection bit string 806, and BIST operation enable bit 807.

The operation mode configuration bit 805 switches the BIST operation and fault diagnosing operation. If this bit is logic "0", the memory is an object of the BIST. If the bit is logic "1", the memories are object of the fault diagnosis. The operation mode configuration bit 805 shown in FIG. 10 is logic "0", indicating that the memories are object of the BIST.

The memory selection bit string 806 is data that sets the selection of a memory as an object of the BIST or fault diagnosis. Each bit corresponds to one memory, and a memory for which the bit is logic "1" is an object of the BIST or fault diagnosis. In the example shown in FIG. 10, all bits (N bits) are logic "1", so all the N memories 7021 to 702N are objects of the BIST.

The BIST operation enable bit 807 is data that sets, for each of the BIST circuits 7071 to 707M, whether the BIST circuit is presently an object of the BIST or fault diagnosis. If this bit is logic "0", the BIST circuit is not an object. If the bit is logic "1", the BIST circuit is an object.

For example, if the BIST circuit 7071 is an object of the BIST or fault diagnosis, the BIST or fault diagnosis is performed on the memory collars 7011 to 701N whose operations are controlled by the BIST circuit 7071.

In a BIST circuit for which logic "0" is set, the multiplexer 7141 performs switching so that the shift transfer path in this BIST circuit does not include the address capture register 7121 and end flag register 7131 but includes only the determination flag register 7161. Accordingly, the determination flag register 7161 alone performs shift, so the number of times of shift can be minimized.

This greatly reduces the number of shift stages compared to the case that although a BIST circuit is not an object of the BIST or fault diagnosis, data passes through all the address capture register 7121, end flag register 7131, and determination flag register 7161, and through the path of a memory collar connected to the register path.

By contrast, if the BIST operation enable bit 807 is logic "1", the shift path includes the paths in the memory collars 7011 to 701N controlled by, e.g., the BIST circuit 7071 as an object of the BIST or fault diagnosis, and includes the address capture register 7121, end flag register 7131, and determination flag register 7161. More specifically, in the paths in the memory collars 7011 to 701N, the shift path includes only the flag register 7051 in the memory collar 7011 that is not an object of the BIST or fault diagnosis, the capture register 7032 having captured the output from the memory 7022 in the memory collar 7012 as an object of the BIST or fault diagnosis, . . . , and the flag register 705N in the memory collar 701N that is not an object of the BIST or fault diagnosis, together with the address capture register 7121, end flag register 7131, and determination flag register 7161, in accordance with the memory selection bit string 806.

If the shift path includes the address capture register 7121, the address capture register 7121 receives the address output from the address register 7111. Therefore, the shift path transfers this address outside.

In the BIST circuit 7071, the BIST configuration decoder 7091 receives the operation mode configuration bit 805, memory selection bit string 806, and BIST operation enable bit 807 output in parallel from the BIST operation configuration register 7081. The BIST configuration decoder 7091 outputs, e.g., switching control signals 7101 to 710N for controlling switching between the outputs from the multiplexers 7061 to 706N in the memory collars 7011 to 701N, and enable signals (not shown) for controlling chip enable of the memories 7021 to 702N.

The sequence of signals and operating configurations when performing a fault diagnosing operation in reference example 3 will be explained below with reference to FIG. 11.

To facilitate a fault analysis, a fault diagnosis is normally performed on a memory included in one of the memory collars 7011 to 701N connected to, e.g., the BIST circuit 7071. Of the memory selection bit string 806 in the BIST operation configuration registers 7081 to 708M, therefore, only one bit corresponding to a memory as an object of the fault diagnosis is set to logic "1".

Figure 11:
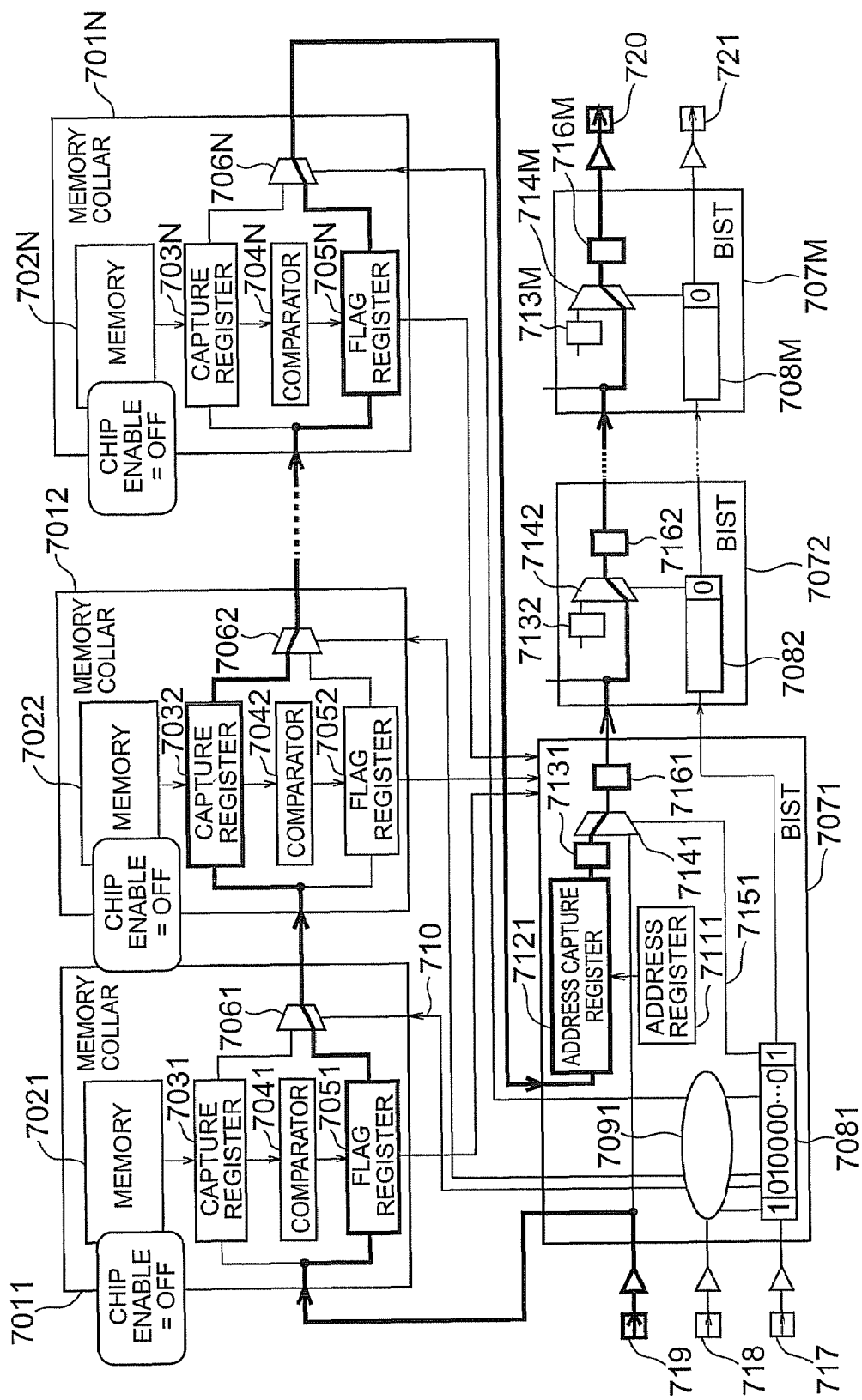
FIG. 11 is a block diagram showing the sequence of signals when diagnosing a fault in the semiconductor integrated circuit.

In this example, the memory 7022 included in the second leftmost memory collar 7012 shown in FIG. 11 is an object, and memories included in other memory collars are not objects. Accordingly, the BIST operation configuration register 7081 in the BIST circuit 7071 sets the memory selection bit string 806 shown in FIG. 10 such that only the second bit from the input terminal 801 of the serial path is logic "1".

The BIST operation enable bit 807 in the BIST operation configuration registers 7081 and 7083 to 708M is set to logic "0" so as to exclude all the memories corresponding to the BIST circuits 7071 and 7073 to 707M from an object of the fault diagnosis.

When executing the fault diagnosis, therefore, the chip enable input signal 803 changes to logic "1" (ON state) for only the memory 7022 for which the corresponding bit is logic "1" in the memory selection bit string 806 of the BIST operation configuration register 7081 in the BIST circuit 7071, and the multiplexer 7062 selectively outputs the serial output from the capture register 7032.

For the memories 7021 and 7023 to 702N connected to the BIST circuit 7071, the chip enable input signal 803 changes to logic "0" (OFF state), and the multiplexers 7061 and 7063 to 706N select the outputs from the flag registers 7051 and 7053 to 705N.

As indicated by the thick lines in FIG. 11, the above operation serially connects the input terminal 719, the flag register 7051 and multiplexer 7061 in the non-selected memory collar 7011, the capture register 7032 and multiplexer 7062 in the selected memory collar 7012, the flag registers 7053 to 705N and multiplexers 7063 to 706N in the non-selected memory collars 7013 to 701N, the address capture register 7121, end flag register 7131, multiplexer 7141, and determination flag register 7161 in the BIST circuit 7071 as an object, the multiplexers 7142 to 714M and determination flag registers 7162 to 716M in the BIST circuits 7072 to 707M that are not objects, and the output terminal 720.

In this arrangement shown in FIG. 11, in the connection path through which the serial input signal is input from the input terminal 719 to the memory collar, the signal is once input to the BIST circuit and then input to the memory collar. However, the circuit may also include a connection path in which the serial input signal is directly input to the memory collar from the input terminal 719 without passing through the BIST circuit.

This configuration sequentially shifts and outputs data that is output from the memory 7022 as an object of the fault diagnosis of the memories 7011 to 701N connected to the BIST circuit 7071, and is captured by the capture register 7032, data in the determination flag registers 7162 to 716M of the unselected memory collars 7012 to 701N, and addresses stored in the address register 7111 of the BIST circuit 7071 as an object of the fault diagnosis and captured by the address capture register 7121.

As a consequence, unnecessary outputs from memories that are not objects of the fault diagnosis need not be shifted or output. This reduces unnecessary power consumption during the execution of the fault diagnosis, and shortens the time required for the fault diagnosis.

In reference example 3, the memory 7022 alone is an object of the fault diagnosis in order to facilitate the fault analysis. However, a plurality of memories can also be objects of the fault diagnosis at the same time, although the fault analysis complicates. For example, when the memories 7021 and 7022 are objects of the fault diagnosis, the capture register 7032 is connected, instead of the flag register 7051, to the serial path indicated by the thick lines in FIG. 11 in the memory collar 7011.

During the fault diagnosing operation, whenever a read operation is performed on, e.g., the memory 7022, the capture register 7032 performs a shift operation, and the output from the memory 7022 is extracted from the external output terminal 720 and observed.

In this case, of the memories 7021 to 702N connected to the BIST circuit 7071, those except for the memory 7022 as an object of the fault diagnosis are shifted one bit as described above. Accordingly, data from the memories 7021 and 7023 to 702N that are not objects of the fault diagnosis need not be shifted or output. This reduces the time required for the fault diagnosis compared to the case that data from all memories are shifted and output.

Also, in the BIST circuits 7072 to 707M, only the determination flag registers 7162 to 716M are connected to the serial path. This reduces the number of steps required for the shift, and shortens the execution time of an external tester necessary for the fault diagnosis.

(2) Second Embodiment

A semiconductor integrated circuit according to the second embodiment of the present invention will be explained below with reference to drawings showing its arrangements. The second embodiment is equivalent to a combination of the arrangement of the BIST circuit 400 and memory collar 416 in the first embodiment shown in FIG. 1, and the arrangement of the BIST circuit 7071 in reference example 3 shown in FIG. 9.

Figure 12:
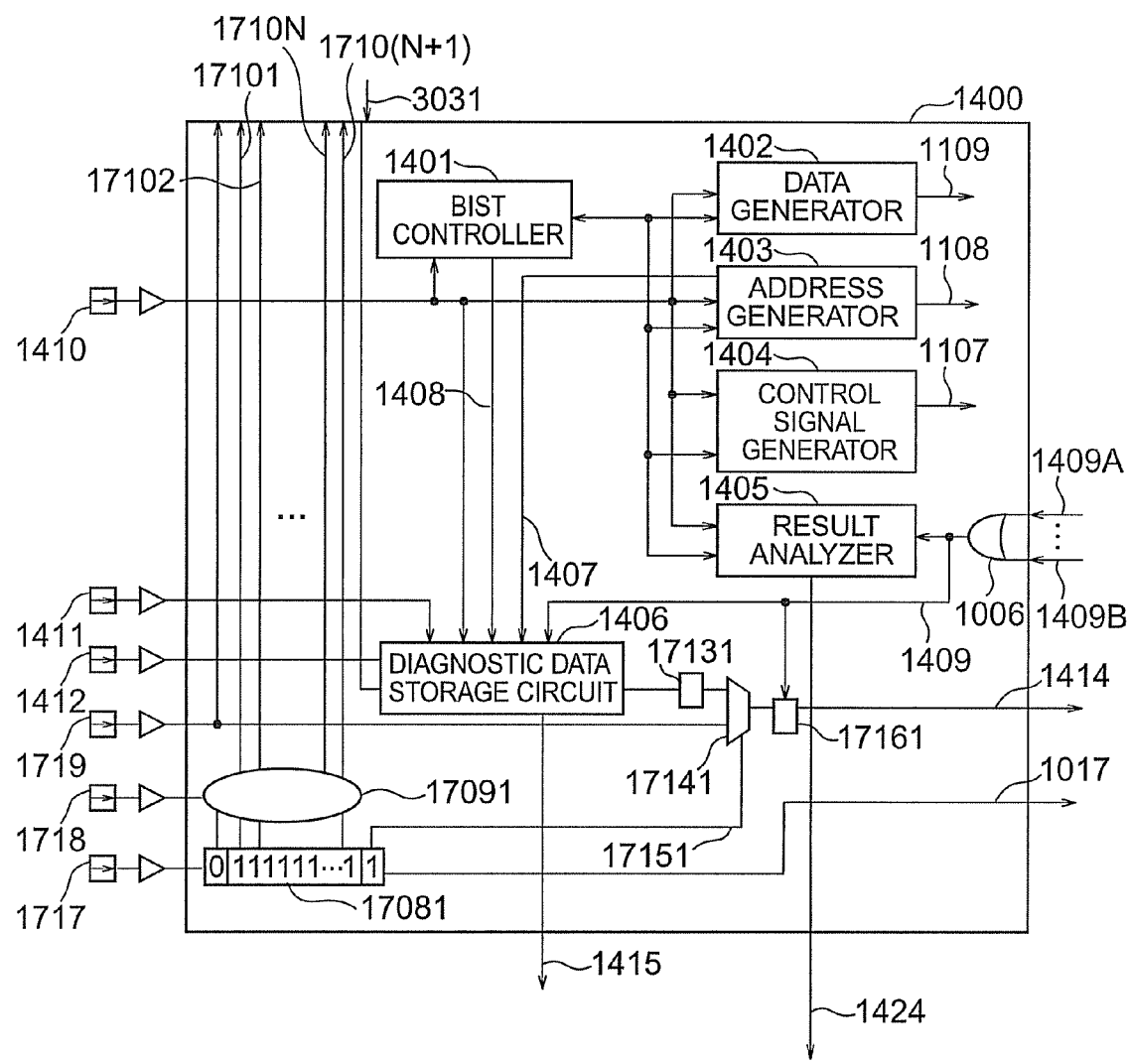
FIG. 12 is a block diagram showing the arrangement of a BIST circuit of a semiconductor integrated circuit that performs a fault diagnosing operation by using a BIST circuit according to the second embodiment of the present invention.
Figure 13:
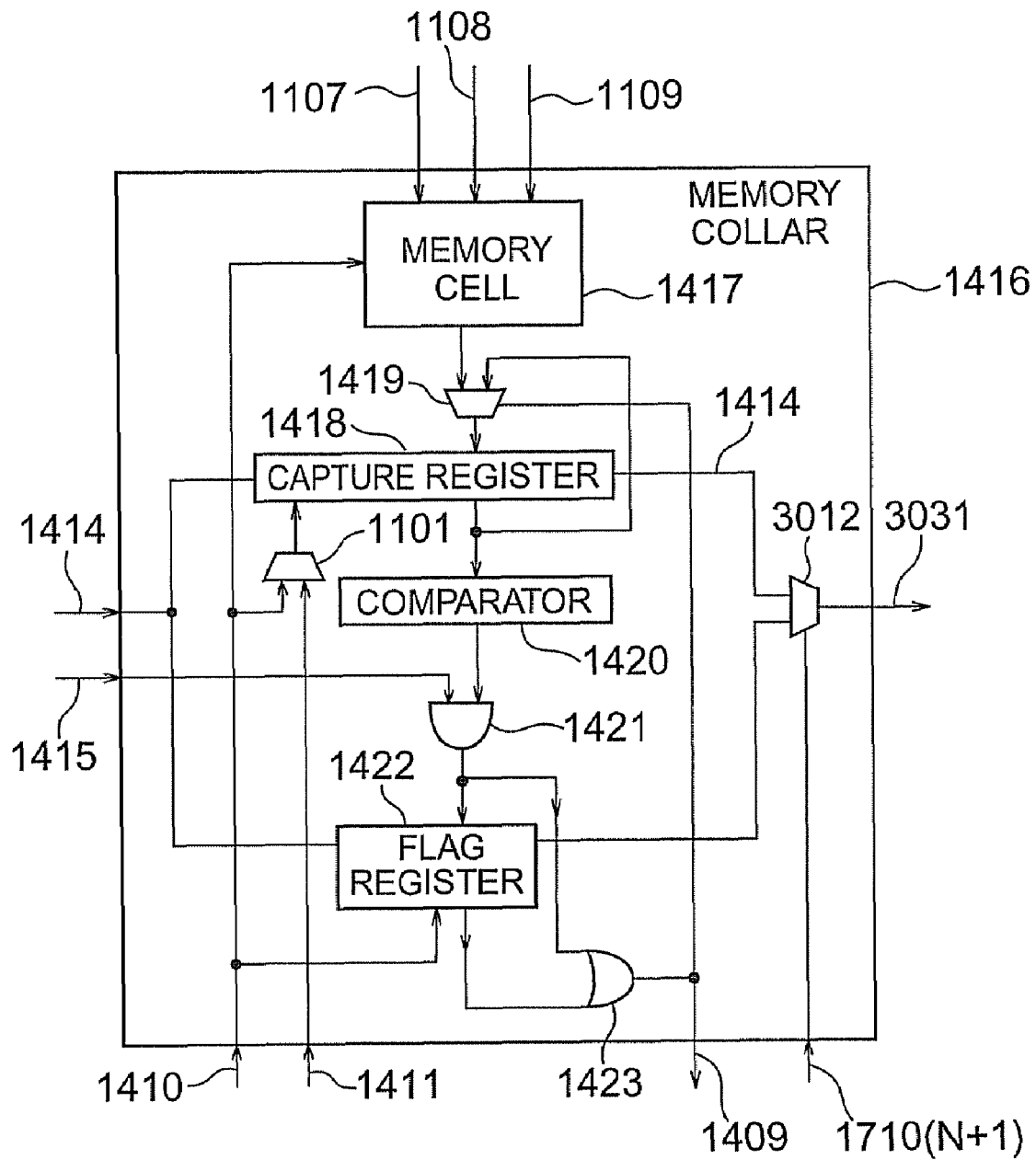
FIG. 13 is a block diagram showing the arrangement of a memory collar of the semiconductor integrated circuit.

In the second embodiment, a BIST circuit 1400 has an arrangement shown in FIG. 12, and a memory collar 1416 has an arrangement shown in FIG. 13.

Similar to the BIST circuit 400 in the first embodiment, the BIST circuit 1400 comprises a BIST controller 1401, data generator 1402, address generator 1403, control signal generator 1404, result analyzer 1405, and diagnostic data storage circuit 1406. In addition, similar to the BIST circuit 7071 in reference example 3, the BIST circuit 1400 comprises a BIST configuration decoder 17091, BIST operation configuration register 17081, BIST completion flag register 17131, multiplexer 17141, and pass/fail flag register 17161.

The BIST circuit 1400 also has an OR circuit 1006. The OR circuit 1006 receives flag signals 1409A to 1409B corresponding to the flag signal 409 in the first embodiment shown in FIG. 1 from a plurality of memory collars 1416, and output the signals to the result analyzer 1405 and diagnostic data storage circuit 1406.

Details of the arrangement of the diagnostic data storage circuit 1406 are the same as the diagnostic data storage circuit 406 in the first embodiment shown in FIG. 2, so a repetitive explanation will be omitted.

Similar to the memory collar 416 in the first embodiment, the memory collar 1416 includes a memory cell 1417, multiplexer 1419, capture register 1418, multiplexer 1101, comparator 1420, AND circuit 1421, flag register 1422, and OR circuit 1423. In addition, the memory collar 1416 has a multiplexer 3012 that receives a switching control signal 1710 (N+1) output from the decoder 17091, and outputs a signal 3031 by selecting one of the output from the capture register 1418 and the output from the flag register 1422.

When a plurality of memory collars 1416 are formed, they are connected in series, and data stored in the capture registers 1418 are serially output outside while the signal 3031 output from the memory collar 1416 in the preceding stage is input as a signal 1414 to the memory collar 1416 in the succeeding stage.

The operation of the second embodiment having the above arrangement will be explained below.

A high-speed clock 1410 is input to the BIST controller 1401, data generator 1402, address generator 1403, control signal generator 1404, and result analyzer 1405. The BIST controller 1401 generates and outputs various signals necessary to control the operations of the data generator 1402, address generator 1403, control signal generator 1404, and result analyzer 1405.

The data generator 1402, address generator 1403, and control signal generator 1401 respectively output data 1109, an address 1108, and a control signal 1107 to the memory cell 1417 in the memory collar 1416.

In the memory collar 1416 of the second embodiment, not only the capture register 1418 but also the flag register 1422 receives and holds the serial output 1414 from the diagnostic data storage circuit 1406. Also, the multiplexer 3012 receives not only the output 1414 from the capture register 1418 but also the output from the flag register 1422, and selectively outputs one of the input data on the basis of the control signal 1710(N+1) output from the diagnostic data storage circuit 406. It is also possible, in the multiplexer 3012, to prevent one of the output 1414 from the capture register 148 and the output from the flag register 1422 from being shifted, while the other one is selected. The rest of the operation is the same as the memory collar 416 according to the first embodiment, so an explanation will not be repeated.

The result analyzer 1405 in the BIST circuit 1400 shown in FIG. 12 receives the flag signal 1409 output from the flag register 1422 via the OR circuit 1423. When performing the BIST on a plurality of memory collars by using one BIST circuit 1400, memory collars 1416 having the above arrangement are formed in one-to-one correspondence with the memory cells, and the result analyzer 1405 receives via the OR circuit 1006 the flag signals 1409A to 1409B output from the flag registers 1422 of the memory collars 1416.

The result analyzer 1405 checks the overall BIST result, and outputs the result as a final BIST result signal 1424 to an external tester.

The diagnostic data storage circuit 1406 also receives the flag signal 1409 output from the flag register 1422 via the OR circuit 1423. In addition, the diagnostic data storage circuit 1406 receives the output 3031 from the memory collar 1416 shown in FIG. 13. If a failure is detected and the flag signal 1409 is generated, the diagnostic data storage circuit 1406 receives information indicating the occurrence of the failure.

In this manner, the BIST circuit performs the BIST operation, and determines if each memory cell 1417 is fault-free.

Then, the diagnostic data storage circuit 1406 performs a fault diagnosis. The circuit configuration and operation of the diagnostic data storage circuit 1406 are the same as the diagnostic data storage circuit 406 according to the first embodiment shown in FIG. 2, so a repetitive explanation will be omitted.

When a plurality of BIST circuits 1400 are arranged, the signal 1414 output from the BIST circuit 1400 in the preceding stage is input as a signal 1719 to the BIST circuit 1400 in the succeeding stage. The signal 1710(N+1) set in the BIST operation configuration register 17081 and decoded by the BIST configuration decoder 17091 sets the switching of the multiplexer 3012. The multiplexer 3012 selects the data output from the memory cell 1417 and captured by the capture register 1418 or the contents held in the flag register 1422, and serially outputs the selected signal outside.

As described above, similar to the first embodiment, the second embodiment can perform the BIST and fault diagnosis of a memory at the system operating speed by using the high-speed clock 1410, thereby obtaining information of a failure that cannot be detected because of a shift operation at a low-speed clock. Also, the second embodiment can minimize the amount of tracing when resuming the BIST after a failure has occurred. Therefore, the testing time can be reduced compared to the case that the BIST is reexecuted by tracing back to the start point of the first BIST.

Furthermore, similar to reference example 3, only data of defective portions are shifted and output outside during the fault diagnosis. This makes it possible to shorten the fault diagnosis time and reduce the cost. In addition, data from memories that are not objects of the fault diagnosis need not be shifted nor output in accordance with the setting in the BIST operation configuration register 17081. This helps further shorten the time required for the fault diagnosis.

The semiconductor integrated circuits of the above embodiments can extract data read out from only a memory as an object of the fault diagnosis, thereby shortening the fault diagnosis time and performing the fault diagnosis at the system operating speed.

Each of the above embodiments is merely an example and does not limit the present invention. Accordingly, these embodiments can be variously modified within the technical scope of the present invention.

What is claimed is:

1. A semiconductor integrated circuit comprising:
   a built-in self test (to be referred to as a BIST hereinafter) circuit having
   a data generator which generates and outputs write data to be supplied to a memory,
   an address generator which generates and outputs an address signal to be supplied to said memory,
   a control signal generator which generates and outputs a control signal for controlling said memory,
   a result analyzer which receives a flag signal, analyzes a result of a BIST, and outputs a BIST result signal,
   a BIST controller which controls operations of said data generator, said address generator, said control signal generator, and said result analyzer, and outputs a BIST state signal indicating a state of the BIST, and
   a diagnostic data storage circuit including a first capture register which captures and outputs, in accordance with a first clock, a latest address signal and the BIST state signal output from said BIST controller while the flag signal is in as state that no fault is detected, and maintains outputs when the flag signal is in a state that a fault is detected, a storage register which receives and stores the outputs from said first capture register in accordance with second clock lower in speed than the first clock while a shift enable signal is in an off state, thereby storing the address signal and the BIST signal corresponding to the supply timing of the flag signal, and outputs the stored contents outside by shifting them when the shift enable signal is in an on state, and flag suppressing means for comparing the outputs from said first capture register with the stored contents of said storage register, and outputting a flag suppression signal, after the flag signal is in a state that a fault is detected, until the latest address signal and the BIST state signal output from said first capture register match the address signal and the BIST control signal stored in said storage register; and
   a memory collar having
   a memory cell which performs a write operation by receiving the write data, the address signal, and the control signal, and reads out and outputs the written data, in accordance with the first clock,
   a second capture register which captures latest data output from said memory cell while the shift enable signal is in an off state and the flag signal is in a state that no fault is detected, maintains held contents when the flag signal is in a state that a fault is detected, and outputs held contents outside by shifting the held contents when the shift enable signal is in an on state,
   a comparator which compares the output from said second capture register with an expected value, and outputs a comparison result signal meaning failure detection if the output and the expected value do not match, and
   a flag register which outputs the flag signal on the basis of the comparison result signal while the flag suppression signal is in an off state, and suppresses the output of the flag signal when the flag suppression signal is in an on state; and
   wherein said BIST controller interrupts the BIST when said flag register outputs the flag signal, and resumes the BIST from a resumption point traced back from the interruption point.

2. A circuit according to claim 1, wherein if data written in said memory from the interruption point to the resumption point is rewritten with data different from data before the BIST is executed from the resumption point to the interruption point, said BIST controller rewrites the written data with the data before the execution of the BIST, and resumes the BIST from the resumption point.

3. A circuit according to claim 2, wherein
   when said memory cell comprises a plurality of memory cells, said memory collar comprises a plurality of memory collars formed in one-to-one correspondence with said memory cells, and said second capture registers in said memory collars are connected in series, and serially output held contents outside by shifting the held contents when the shift enable signal is supplied.

4. A circuit according to claim 2, wherein when said BIST circuit comprises a plurality of BIST circuits, said storage registers in said diagnostic data storage circuits are connected in series, and serially output stored contents outside by shifting the stored contents when the shift enable signal is supplied.

5. A circuit according to claim 2, wherein said BIST controller comprises:
a data generator control block which outputs a data generator control signal for controlling the operation of said data generator;
an address generator control block which outputs an address generator control signal for controlling the operation of said address generator;
a control signal generator control block which outputs a control signal generator control signal for controlling the operation of said control signal generator;
a result analyzer control block which outputs a result analyzer control signal for controlling the operation of said result analyzer; and
a BIST controller which outputs the BIST state signal.

6. A circuit according to claim 1, wherein if data written in said memory from the interruption point to the resumption point is rewritten with data different from data before the BIST is executed from the resumption point to the interruption point, said BIST controller rewrites the written data with the data before the execution of the BIST, and resumes the BIST from the resumption point.

7. A circuit according to claim 1, wherein
when said memory cell comprises a plurality of memory cells, said memory collar comprises a plurality of memory collars formed in one-to-one correspondence with said memory cells, and
said second capture registers in said memory collars are connected in series, and serially output held contents outside by shifting the held contents when the shift enable signal is supplied.

8. A circuit according to claim 1, wherein
when said memory cell comprises a plurality of memory cells, said memory collar comprises a plurality of memory collars formed in one-to-one correspondence with said memory cells, and
said second capture registers in said memory collars are connected in series, and serially output held contents outside by shifting the held contents when the shift enable signal is supplied.

9. A circuit according to claim 1, wherein when said BIST circuit comprises a plurality of BIST circuits, said storage registers in said diagnostic data storage circuits are connected in series, and serially output stored contents outside by shifting the stored contents when the shift enable signal is supplied.

10. A circuit according to claim 1, wherein when said BIST circuit comprises a plurality of BIST circuits, said storage registers in said diagnostic data storage circuits are connected in series, and serially output stored contents outside by shifting the stored contents when the shift enable signal is supplied.

11. A circuit according to claim 1, wherein said BIST controller comprises:
a data generator control block which outputs a data generator control signal for controlling the operation of said data generator;
an address generator control block which outputs an address generator control signal for controlling the operation of said address generator;
a control signal generator control block which outputs a control signal generator control signal for controlling the operation of said control signal generator;
a result analyzer control block which outputs a result analyzer control signal for controlling the operation of said result analyzer; and
a BIST controller which outputs the BIST state signal.

12. A circuit according to claim 1, wherein said BIST controller comprises:
a data generator control block which outputs a data generator control signal for controlling the operation of said data generator;
an address generator control block which outputs an address generator control signal for controlling the operation of said address generator;
a control signal generator control block which outputs a control signal generator control signal for controlling the operation of said control signal generator;
a result analyzer control block which outputs a result analyzer control signal for controlling the operation of said result analyzer; and
a BIST controller which outputs the BIST state signal.

13. A semiconductor integrated circuit comprising:
a plurality of BIST circuits each having
a BIST operation configuration register which receives operation configuration data, and sets at least whether the BIST circuit is an object of a BIST, and whether a memory is an object of the BIST,
a data generator which generates and outputs write data to be supplied to said memory,
an address generator which generates and outputs an address signal to be supplied to said memory,
a control signal generator which generates and outputs a control signal for controlling said memory,
a result analyzer which receives a flag signal, analyzes a result of the BIST, and outputs a BIST result signal,
a BIST controller which controls operations of said data generator, said address generator, said control signal generator, and said result analyzer, and outputs a BIST state signal indicating a state of the BIST,
a diagnostic data storage circuit including a first capture register which captures and outputs, in accordance with a first clock, a latest address signal and the BIST state signal output from said BIST controller while the flag signal is in a state that no fault is detected, and maintains outputs when the flag signal is in a state that a fault is detected, a storage register which receives and stores the outputs from said first capture register in accordance with a second clock lower in speed than the first clock while a shift enable signal is in an off state, thereby storing the address signal and the BIST signal corresponding to the supply timing of the flag signal, and outputs the stored contents outside by shifting them when the shift enable signal is in an on state, and flag suppressing means for comparing the outputs from said first capture register with the stored contents of said storage register, and outputting a flag suppression signal, after the flag signal is in a state that a fault is detected, until the latest address signal and the BIST state signal output from said first capture register match the address signal and the BIST control signal stored in said storage register, and
a first multiplexer which selectively outputs one of the stored contents of said storage register and an input signal, in accordance with the contents set in said BIST operation configuration register, said first multiplexers being connected in series; and a plurality of memory collars each having a memory cell which performs a write operation by receiving the write data, the address signal, and the control signal, and reads out and outputs the written data, in accordance with the first clock, a second capture register which receives latest data output from said memory cell while the shift enable signal is in an off state and the flag signal is in a state that no fault is detected, maintains held contents when the flag signal is in a state that a fault is detected, and outputs held contents outside by shifting the held contents when the shift enable signal is in an on state, a comparator which compares the output from said second capture register with an expected value, and outputs a comparison result signal meaning failure detection if the output and the expected value do not match, a flag register which outputs the flag signal on the basis of the comparison result signal while no flag suppression signal is supplied, and suppresses the output of the flag signal when the flag suppression signal is supplied, and a second multiplexer which selectively outputs one of the held contents of said second capture register and the output from said flag register, in accordance with the contents set in said BIST operation configuration register, said second multiplexers being connected in series; and wherein said BIST controller interrupts the BIST when said flag register outputs the flag signal, and resumes the BIST from a resumption point traced back from the interruption point.

14. A circuit according to claim 13, wherein if data written in said memory from the interruption point to the resumption point is rewritten with data different from data before the BIST is executed from the resumption point to the interruption point, said BIST controller rewrites the written data with the data before the execution of the BIST, and resumes the BIST from the resumption point.

15. A circuit according to claim 14, wherein said BIST controller comprises:

a data generator control block which outputs a data generator control signal for controlling the operation of said data generator;

an address generator control block which outputs an address generator control signal for controlling the operation of said address generator;

a control signal generator control block which outputs a control signal generator control signal for controlling the operation of said control signal generator;

a result analyzer control block which outputs a result analyzer control signal for controlling the operation of said result analyzer; and a BIST controller which outputs the BIST state signal.

16. A circuit according to claim 13, wherein if data written in said memory from the interruption point to the resumption point is rewritten with data different from data before the BIST is executed from the resumption point to the interruption point, said BIST controller rewrites the written data with the data before the execution of the BIST, and resumes the BIST from the resumption point.

17. A circuit according to claim 13, wherein said BIST controller comprises:

a data generator control block which outputs a data generator control signal for controlling the operation of said data generator;

an address generator control block which outputs an address generator control signal for controlling the operation of said address generator;

a control signal generator control block which outputs a control signal generator control signal for controlling the operation of said control signal generator;

a result analyzer control block which outputs a result analyzer control signal for controlling the operation of said result analyzer; and a BIST controller which outputs the BIST state signal.

18. A circuit according to claim 13, wherein said BIST controller comprises:

a data generator control block which outputs a data generator control signal for controlling the operation of said data generator;

an address generator control block which outputs an address generator control signal for controlling the operation of said address generator;

a control signal generator control block which outputs a control signal generator control signal for controlling the operation of said control signal generator;

a result analyzer control block which outputs a result analyzer control signal for controlling the operation of said result analyzer; and a BIST controller which outputs the BIST state signal.

* * * * *